(12) United States Patent
Tadokoro et al.

(10) Patent No.: US 7,968,260 B2
(45) Date of Patent: Jun. 28, 2011

(54) SUBSTRATE PROCESSING METHOD, COMPUTER-READABLE STORAGE MEDIUM, AND SUBSTRATE PROCESSING SYSTEM

(75) Inventors: Masahide Tadokoro, Koshi (JP); Kunie Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 271 days.

(21) Appl. No.: 12/369,198

(22) Filed: Feb. 11, 2009

(65) Prior Publication Data

US 2009/0214963 A1    Aug. 27, 2009

(30) Foreign Application Priority Data

Feb. 25, 2008    (JP) ................................. 2008-042606

(51) Int. Cl.
*G03C 5/00* (2006.01)
*G03F 9/00* (2006.01)
(52) U.S. Cl. ........... 430/30; 430/313; 430/323; 430/330
(58) Field of Classification Search .................... 430/30, 430/313, 323, 330
See application file for complete search history.

(56) References Cited

FOREIGN PATENT DOCUMENTS

| JP | 2001-143850 | 5/2001 |
|---|---|---|
| JP | 2004-207703 | 7/2004 |
| JP | 2006-222354 | 8/2006 |
| JP | 2006-228816 | 8/2006 |

*Primary Examiner* — Christopher G Young
(74) *Attorney, Agent, or Firm* — Oblon, Spivak, McClelland, Maier & Neustadt, L.L.P.

(57) ABSTRACT

The present invention has: a first step of measuring, as an initial condition of a substrate, any of a film thickness of a processing film on the substrate, a refractive index of the processing film, an absorption coefficient of the processing film, and a warpage amount of the substrate; a second step of estimating a dimension of a pattern of the processing film after predetermined processing from a previously obtained first relation between the initial condition and the dimension of the pattern of the processing film based on a measurement result of the initial condition; a third step of obtaining a correction value for a processing condition of the predetermined processing from a previously obtained second relation between the processing condition of the predetermined processing and the dimension of the pattern of the processing film based on an estimation result of the dimension of the pattern; a fourth step of correcting the processing condition of the predetermined processing based on the correction value; and a fifth step of performing predetermined processing on the substrate under the corrected processing condition to form the predetermined pattern in the processing film on the substrate.

9 Claims, 17 Drawing Sheets

FIG.18
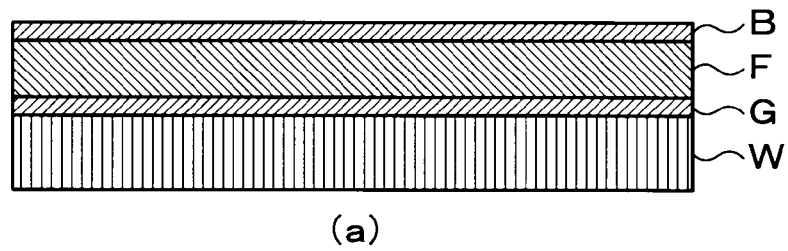
(a)
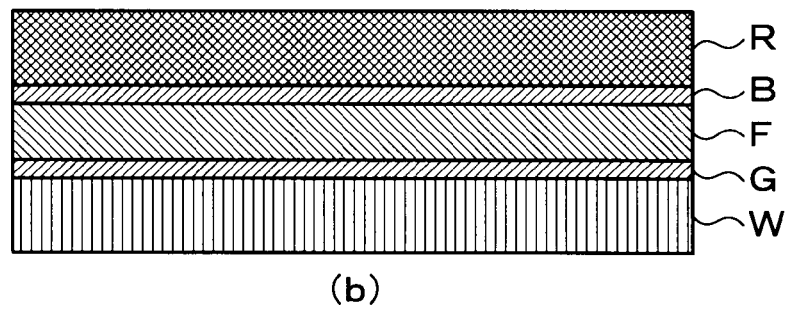
(b)
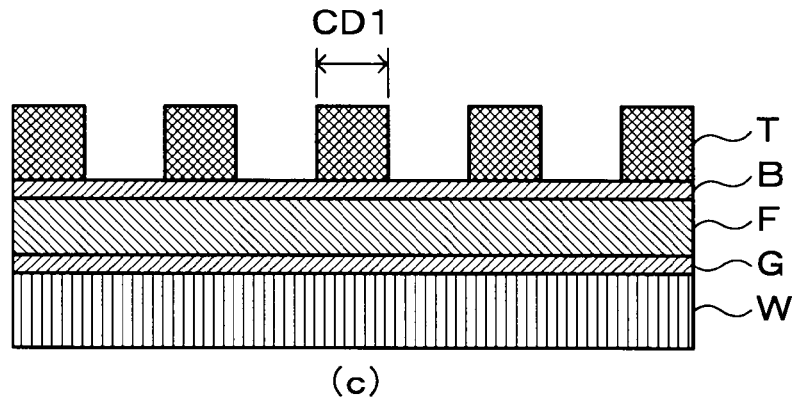
(c)
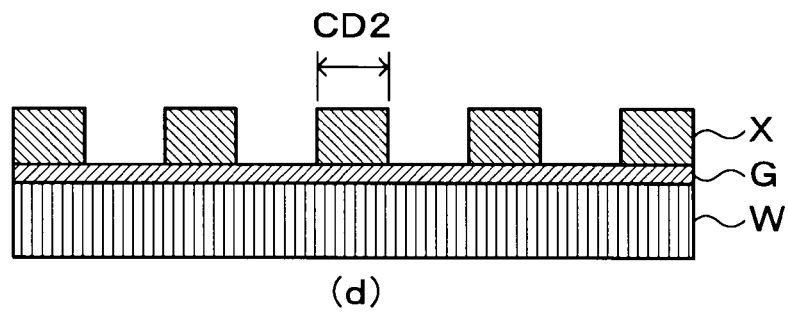
(d)

FIG.19
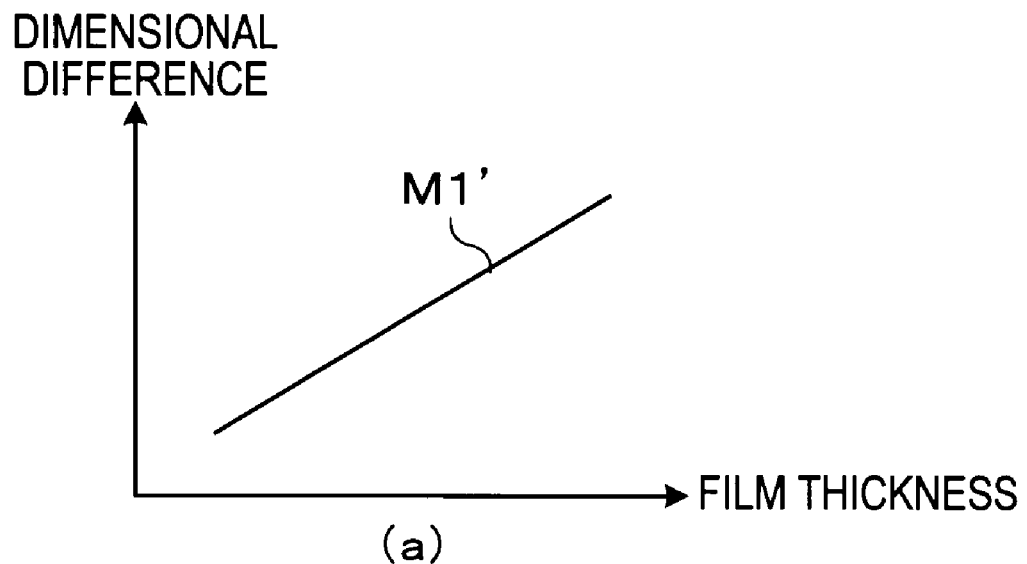
(a)
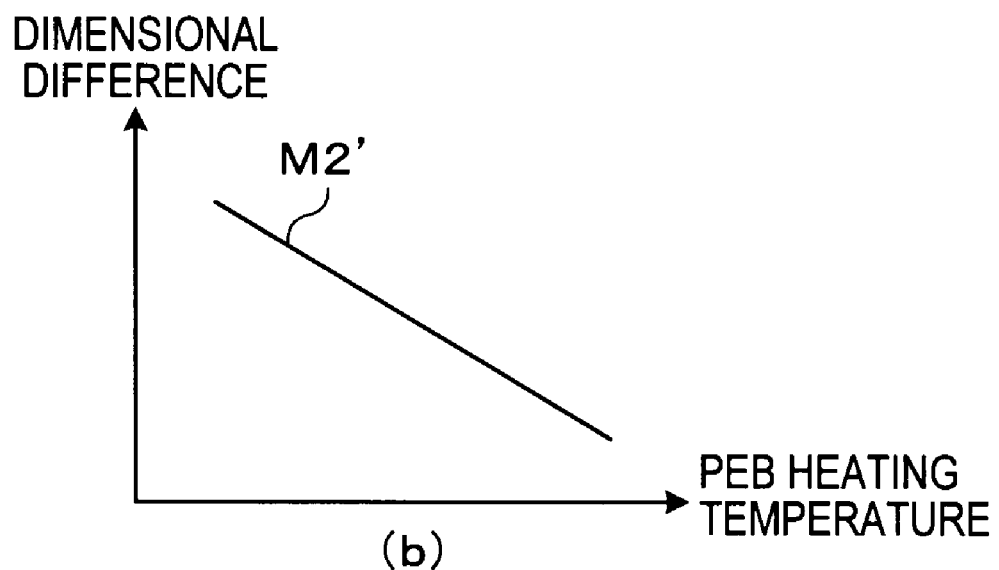
(b)

SUBSTRATE PROCESSING METHOD, COMPUTER-READABLE STORAGE MEDIUM, AND SUBSTRATE PROCESSING SYSTEM

BACKGROUND OF THE INVENTION

1. Field of the Invention

The present invention relates to a substrate processing method of performing predetermined processing on a substrate on which a processing film has been formed to form a predetermined pattern in the processing film on the substrate, a computer storage medium and a substrate processing system.

2. Description of the Related Art

In the manufacturing process of a semiconductor device, for example, photolithography processing in which a resist coating treatment of applying a resist solution onto a semiconductor wafer (hereinafter, referred to as a "wafer"), exposure processing of exposing a predetermined pattern to light on the resist film, a developing treatment of developing the exposed resist film and so on in sequence is performed to form a predetermined resist pattern on the wafer. An etching treatment is performed, using this resist pattern as a mask, on a processing film above the wafer, for example, a Poly-Si film on a $SiO_2$ film, and thereafter a removing processing of the resist film and so on are performed to form the predetermined pattern in the processing film.

The above-described resist pattern is to determine a pattern form of the processing film thereunder and thus needs to be formed in an exact dimension. For this end, it has been proposed that photolithography processing is performed first, for example, on an inspection wafer to form a resist pattern on the processing film on the wafer, and the dimension such as the line width or the like of the resist pattern is measured. Thereafter, based on the measurement result of the dimension, conditions of various processing and treatment of the photolithography processing performed on the wafer are corrected to make the dimension of the resist pattern appropriate (Japanese Patent Application Laid-open No. 2006-228816).

SUMMARY OF THE INVENTION

However, when wafers are successively processed, parameters affecting only the dimension of the pattern of the processing film formed after the etching treatment may vary with time. In this case, even if the resist pattern after the photolithography processing can be made appropriate as described above, it has been difficult to form the pattern of the processing film in a predetermined dimension for each wafer.

The present invention has been developed in consideration of the above point, and its object is to form a pattern of a processing film in a predetermined dimension for each substrate.

To attain the above object, the present invention is a substrate processing method of performing predetermined processing on a substrate on which a processing film has been formed, to form a predetermined pattern in the processing film on the substrate, the method including: a first step of measuring, as an initial condition of the substrate, any of a film thickness of the processing film on the substrate, a refractive index of the processing film, an absorption coefficient of the processing film, and a warpage amount of the substrate; a second step of estimating a dimension of the pattern of the processing film after the predetermined processing from a previously obtained first relation between the initial condition and the dimension of the pattern of the processing film based on a measurement result of the initial condition; a third step of obtaining a correction value for a processing condition of the predetermined processing from a previously obtained second relation between the processing condition of the predetermined processing and the dimension of the pattern of the processing film based on an estimation result of the dimension of the pattern; a fourth step of correcting the processing condition of the predetermined processing based on the correction value; and a fifth step of performing predetermined processing on the substrate under the corrected processing condition to form the predetermined pattern in the processing film on the substrate.

By the inventors' study, it has been found that when processing is performed on substrates in succession to form a pattern of a processing film on each of the substrates, the cause of failing to form the pattern of the processing film in a predetermined dimension for each of the substrates is the film thickness, the refractive index of light (hereinafter, referred to as an "n-value") and the absorption coefficient of light (hereinafter, referred to as a "k-value") of the processing film before predetermined processing or the warpage amount of the substrate vary/varies with time. Hence, according to the present invention, any of initial conditions such as the film thickness, the n-value and the k-value of the processing film before the predetermined processing, and the warpage amount of the substrate is first measured, so that a pattern of the processing film after the predetermined processing can be estimated from the measurement result of the initial condition and the first relation, and based on the pattern estimation result, a correction value for the processing condition of the predetermined processing can be obtained from the second relation. Since the processing condition of the predetermined processing is then corrected based on the correction value, and thereafter the predetermined processing is performed on the substrate under the corrected processing condition, a pattern in the predetermined dimension can be formed in the processing film on or above the substrate. Accordingly, even when processing is performed on substrates in succession, the processing condition of the predetermined processing can be corrected in such a manner for each of the substrates according to the initial condition of the substrate, so that the pattern of the processing film can be formed in the predetermined dimension for each of the substrates. In other words, according to the present invention, the processing condition of the predetermined processing can be corrected for each of the substrates according to the initial condition of the substrate to make the dimension of the pattern of the processing film into the predetermined dimension for each of the substrates.

According to another aspect, the present invention is a computer-readable storage medium storing a program running on a computer of a control unit which controls a substrate processing system in order to execute a substrate processing method by the substrate processing system.

According to still another aspect, the present invention is a substrate processing system for performing predetermined processing on a substrate on which a processing film has been formed, to form a predetermined pattern in the processing film on the substrate, the system including: a measuring apparatus for measuring, as an initial condition of the substrate, any of a film thickness of the processing film on the substrate, a refractive index of the processing film, an absorption coefficient of the processing film, and a warpage amount of the substrate; a coating and developing treatment apparatus for performing photolithography processing on the substrate after the measurement of the initial condition in the measuring apparatus, to form a resist pattern on the processing film on the substrate; an etching treatment apparatus for etching the processing film into a predetermined pattern using the resist pattern as a mask; and a control unit having a first relation between the initial condition and a dimension of the pattern of the processing film and a second relation between a processing condition of the predetermined processing and the dimension of the pattern of the processing film. The control unit estimates a dimension of the pattern of the processing film after the etching treatment from the first relation based on a measurement result of the initial condition in the measuring apparatus, and corrects the processing condition of the predetermined processing in the photolithography processing or the etching treatment from the second relation based on an estimation result of the dimension of the pattern.

BRIEF DESCRIPTION OF THE DRAWINGS

FIG. 18 is an explanatory view showing the state of films on and above the wafer in each of the steps, FIG. 18(a) showing a state in which an anti-reflection film is formed above the wafer, FIG. 18(b) showing a state in which a resist film is formed above the wafer, FIG. 18(c) showing a state in which a resist pattern is formed above the wafer, and FIG. 18(d) showing a state in which a predetermined pattern is formed in the processing film;

FIG. 19 shows graphs indicating a first correlation and a second correlation in another embodiment, FIG. 19(a) indicating the first correlation between the film thickness and the dimensional difference, and FIG. 19(b) indicating the second correlation between the PEB heating temperature and the dimensional difference;

DETAILED DESCRIPTION OF THE INVENTION

Figure 1:
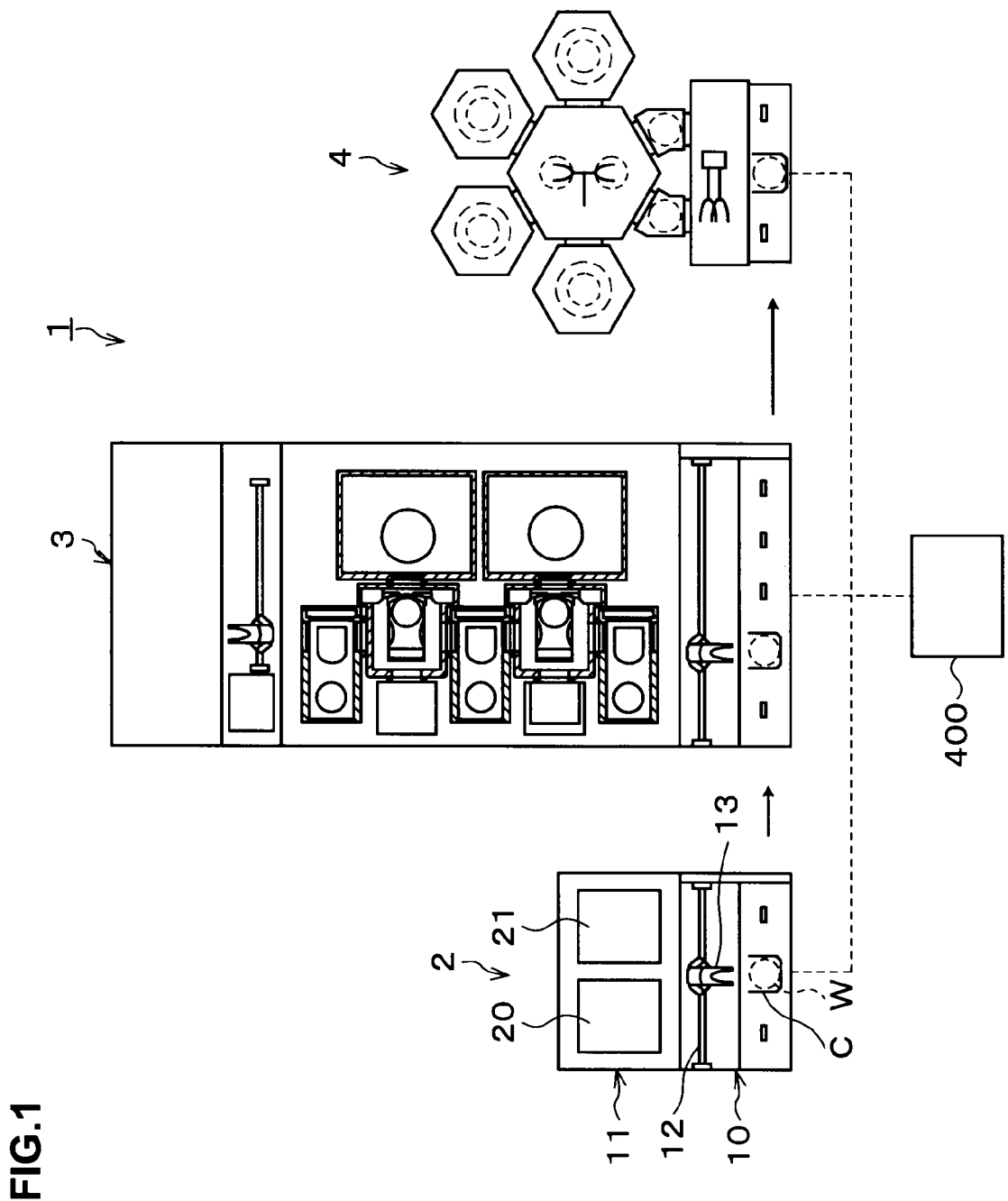
FIG. 1 is an explanatory view showing the outline of a configuration of a substrate processing system according to this embodiment.
Figure 2:
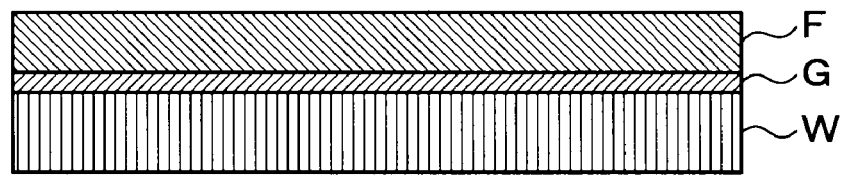
FIG. 2 is a longitudinal sectional view of a wafer before processing.

Hereinafter, preferred embodiments of the present invention will be described. FIG. 1 is a plan view showing the outline of a configuration of a substrate processing system 1 according to this embodiment. Note that in this embodiment, a processing film F and a base film G have been already formed above and on a wafer W as shown in FIG. 2. The processing film F is, for example, a Poly-Si film and the base film G is, for example, a $SiO_2$ film.

The substrate processing system 1 has a measuring apparatus 2 which measures later-described initial conditions of the wafer W, a coating and developing treatment apparatus 3 which performs photolithography processing on the wafer W, and an etching treatment apparatus 4 which performs etching treatment on the processing film F above the wafer W as shown in FIG. 1.

The measuring apparatus 2 has, as shown in FIG. 1, a configuration in which, for example, a cassette station 10 for transferring, for example, 25 wafers W per cassette as a unit from/to the outside into/from the measuring apparatus 2 and transferring the wafers W into/from a cassette C; and an inspection station 11 for performing predetermined inspection on the wafers W are integrally connected.

In the cassette station 10, a plurality of cassettes C can be mounted in a line. In the cassette station 10, a wafer transfer body 13 is provided which is movable along an X-direction on a transfer path 12. The wafer transfer body 13 is movable also in an arrangement direction of the wafers W housed in the cassette C (the vertical direction), and thus can selectively access the wafers W vertically arranged in the cassette C. The wafer transfer body 13 is also rotatable around its axis in the vertical direction, and can access a film measuring device 20 and a warpage measuring unit 21 on the inspection station 11 side.

The inspection station 11 has the film measuring device 20 which measures the film thickness, the n-value, the k-value and so on of each of the processing film F above the wafer W and the base film G for the processing film F, and the warpage measuring unit 21 which measures the warpage amount of the wafer W. Note that the film thickness, the n-value, and the k-value of each of the processing film F and the base film G and the warpage amount of the wafer W are referred to as the initial conditions of the wafer W.

Figure 3:
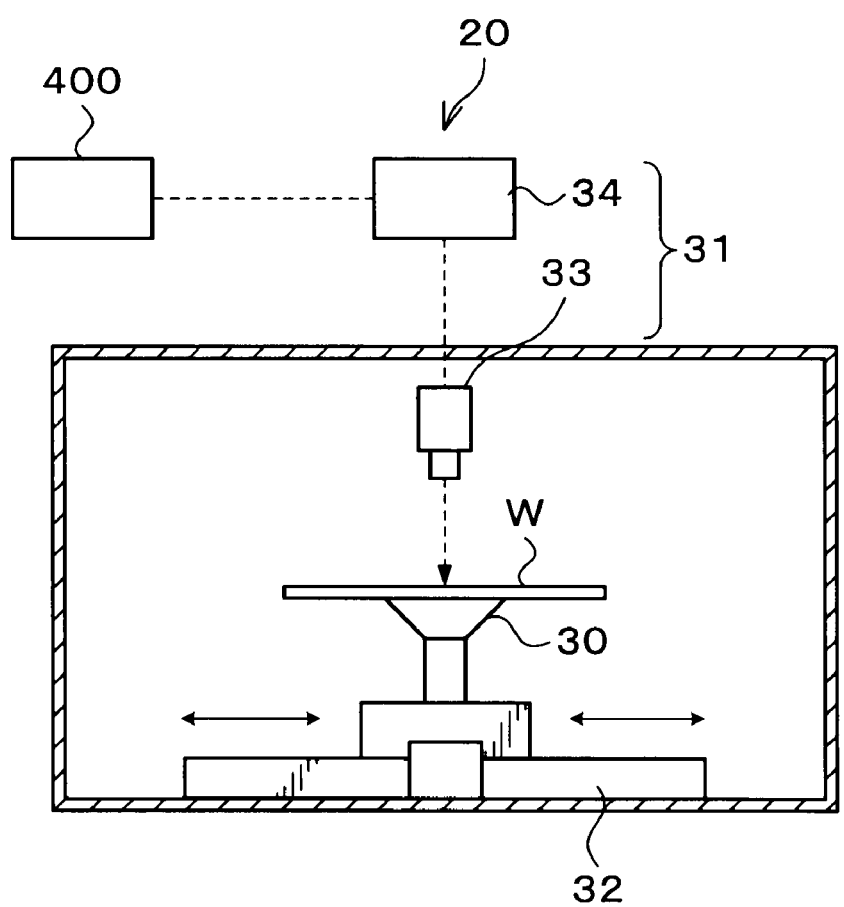
FIG. 3 is a longitudinal sectional view of the outline of a configuration of a film measuring unit.
Figure 4:
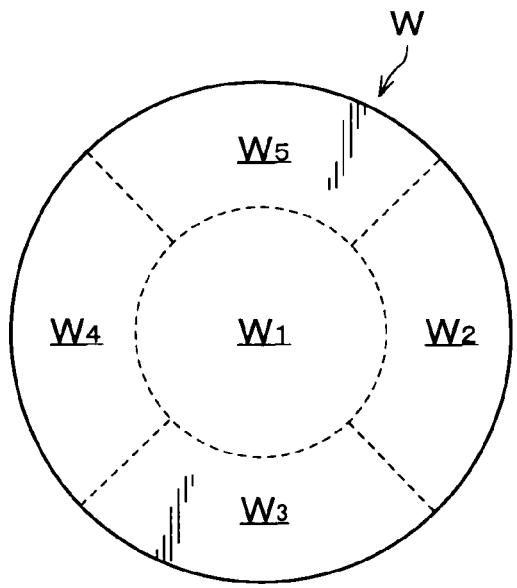
FIG. 4 is an explanatory view showing divided wafer regions.

The film measuring unit 20 has a chuck 30 which horizontally holds the wafer W thereon and an optical interference measuring device 31 as shown in FIG. 3. The chuck 30 is located at a stage 32 and is movable in two dimensional directions that are horizontal directions. The optical interference measuring device 31 has a probe 33 which applies light to the wafer W and receives its reflected light, and a measuring part 34 which measures the film thickness, the n-value, and the k-value of each of the processing film F and the base film G above and on the wafer W based on the light reception information from the probe 33. By moving the wafer W relative to the probe 33, the film thickness, the n-value, and the k-value of each of the processing film and the base film G in each of a plurality of regions within the wafer, for example, wafer regions $W_1$ to $W_5$ as shown in FIG. 4. Note that the wafer regions $W_1$ to $W_5$ correspond to thermal plate regions $R_1$ to $R_5$ in later-described post-exposure baking units 174 to 179 (hereinafter, referred to as "PEB units") of the coating and developing treatment apparatus 3. Further, the measurement results of the film thickness, the n-value, and the k-value are outputted to a later-described control unit 400.

Figure 5:
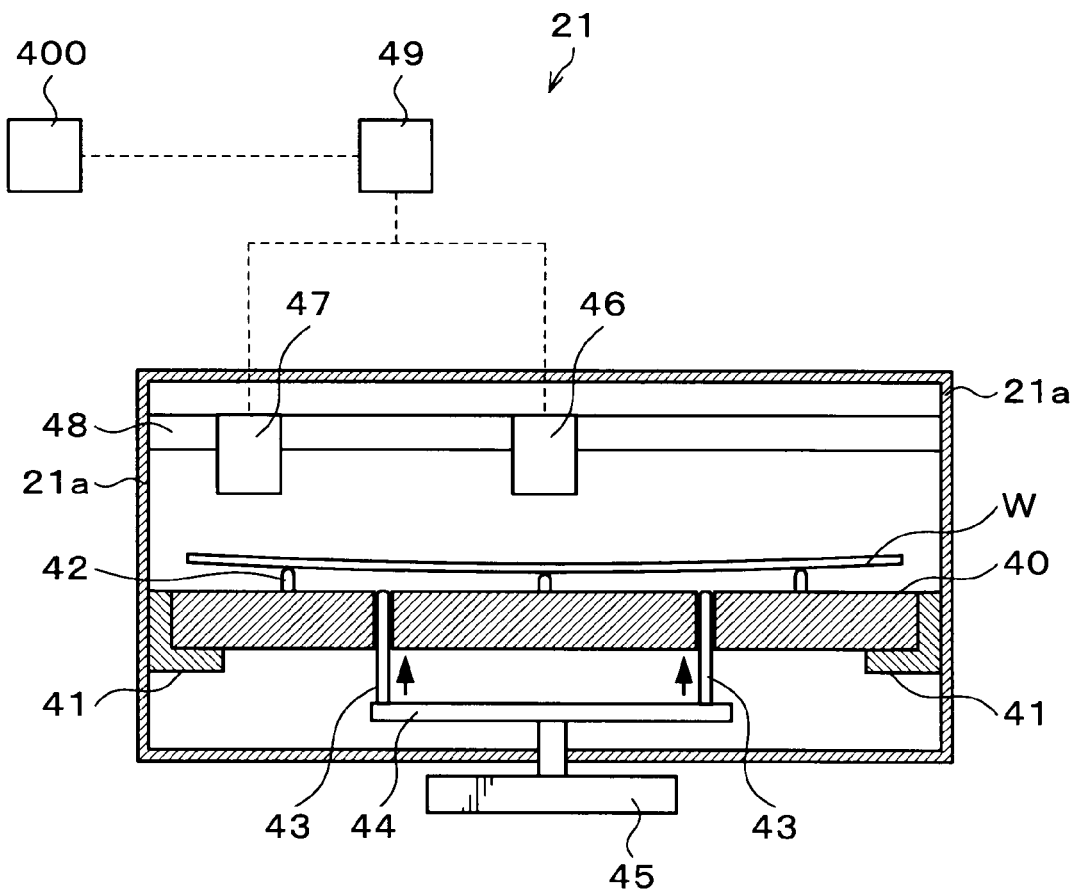
FIG. 5 is a longitudinal sectional view showing the outline of a configuration of a warpage measuring unit.

The warpage measuring unit 21 has a mounting table 40 therein which mounts the wafer W thereon as shown in FIG. 5. The mounting table 40 is horizontally installed, for example, by means of a mounting table supports 41 fixed to a side wall 21a of the warpage measuring unit 21. On a mounting surface of the mounting table 40, a plurality of support pins 42 for supporting the wafer W are provided. Below the mounting table 40, a plurality of raising and lowering pins 43 are provided which can rise and lower through the mounting table 40. A drive mechanism 45 is provided for the raising and lowering pins 43 via a bracket 44 so that the raising and lowering pins 43 rise and lower by operation of the drive mechanism 45.

Above the mounting table 40, for example, two laser displacement gauges 46 and 47 are provided which are fixed to the side wall 21a by a gauge support 48. The laser displacement gauge 46 is provided at a point above the wafer W closer to the center of the wafer W, and the laser displacement gauge 47 is provided at a point above the wafer W closer to the outer periphery of the wafer W. Each of the laser displacement gauges 46 and 47 can measure the distance to the front surface of the wafer W. The measurement results of each of the laser displacement gauges 46 and 47 are outputted to a measuring part 49 so that the warpage amount and the like of the wafer W are measured for each of the above-described wafer regions $W_1$ to $W_5$. The warpage amounts of the wafer W are outputted to the later-described control unit 400.

Figure 6:
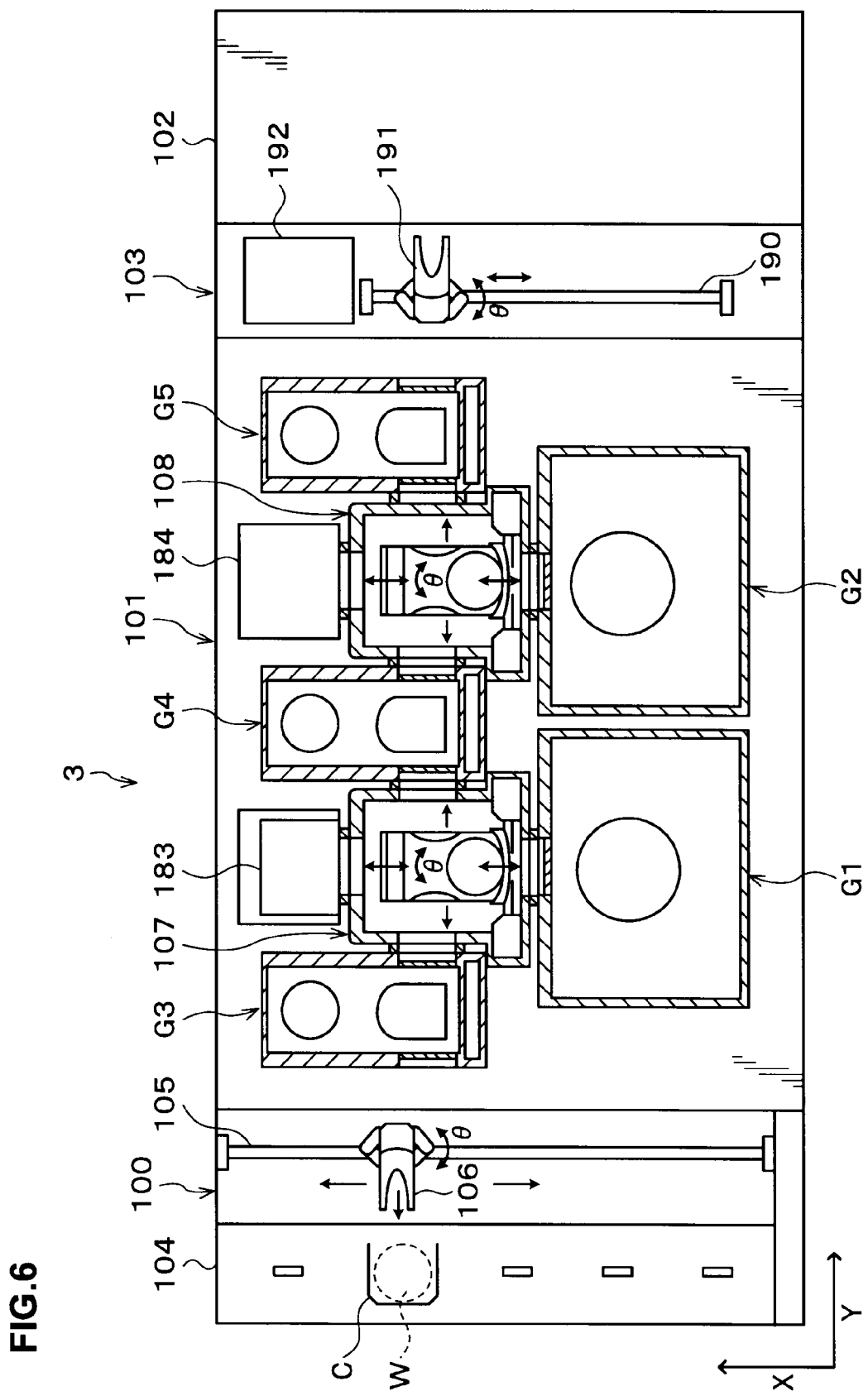
FIG. 6 is a plan view showing the outline of a configuration of a coating and developing treatment apparatus.

The coating and developing treatment apparatus 3 has, as shown in FIG. 6, a configuration in which, for example, a cassette station 100 for transferring, for example, 25 wafers W per cassette as a unit from/to the outside into/from the coating and developing treatment apparatus 3 and transferring the wafers W into/out of the cassette C; a processing station 101 including a plurality of various kinds of processing and treatment units, which are multi-tiered, for performing predetermined processing or treatment in a manner of single wafer processing in the photolithography processing; and an interface station 103 for delivering the wafers W to/from an aligner 102 provided adjacent to the processing station 101, are integrally connected together.

In the cassette station 100, a cassette mounting table 104 is provided and configured such that a plurality of cassettes C can be mounted thereon in a line in an X-direction (a top-to-bottom direction in FIG. 6). In the cassette station 100, a wafer transfer body 106 is provided which is movable in the X-direction on a transfer path 105. The wafer transfer body 106 is also movable in a wafer-arrangement direction of the wafers W housed in the cassette C (a Z-direction; the vertical direction), and thus can selectively access the wafers W in each of the cassettes C arranged in the X-direction.

The wafer transfer body 106, which is rotatable in a θ-direction around the Z-axis, can access a temperature regulating unit 150 and a transition unit 151 for passing the wafer W included in a later-described third processing unit group G3 on the processing station 101 side.

The processing station 101 adjacent to the cassette station 100 includes, for example, five processing unit groups G1 to G5 in each of which a plurality of processing and treatment units are multi-tiered. On the side of the negative direction in the X-direction (the downward direction in FIG. 6) in the processing station 101, the first processing unit group G1 and the second processing unit group G2 are placed in order from the cassette station 100 side. On the side of the positive direction in the X-direction (the upward direction in FIG. 6) in the processing station 101, the third processing unit group G3, the fourth processing unit group G4, and the fifth processing unit group G5 are placed in order from the cassette station 100 side. Between the third processing unit group G3 and the fourth processing unit group G4, a first transfer unit 107 is provided. The first transfer unit 107 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 108 is provided. The second transfer unit 108 can selectively access the processing and treatment units in the second processing unit group G2, the fourth processing unit group G4, and the fifth processing unit group G5 and transfer the wafer W to them.

Figure 7:
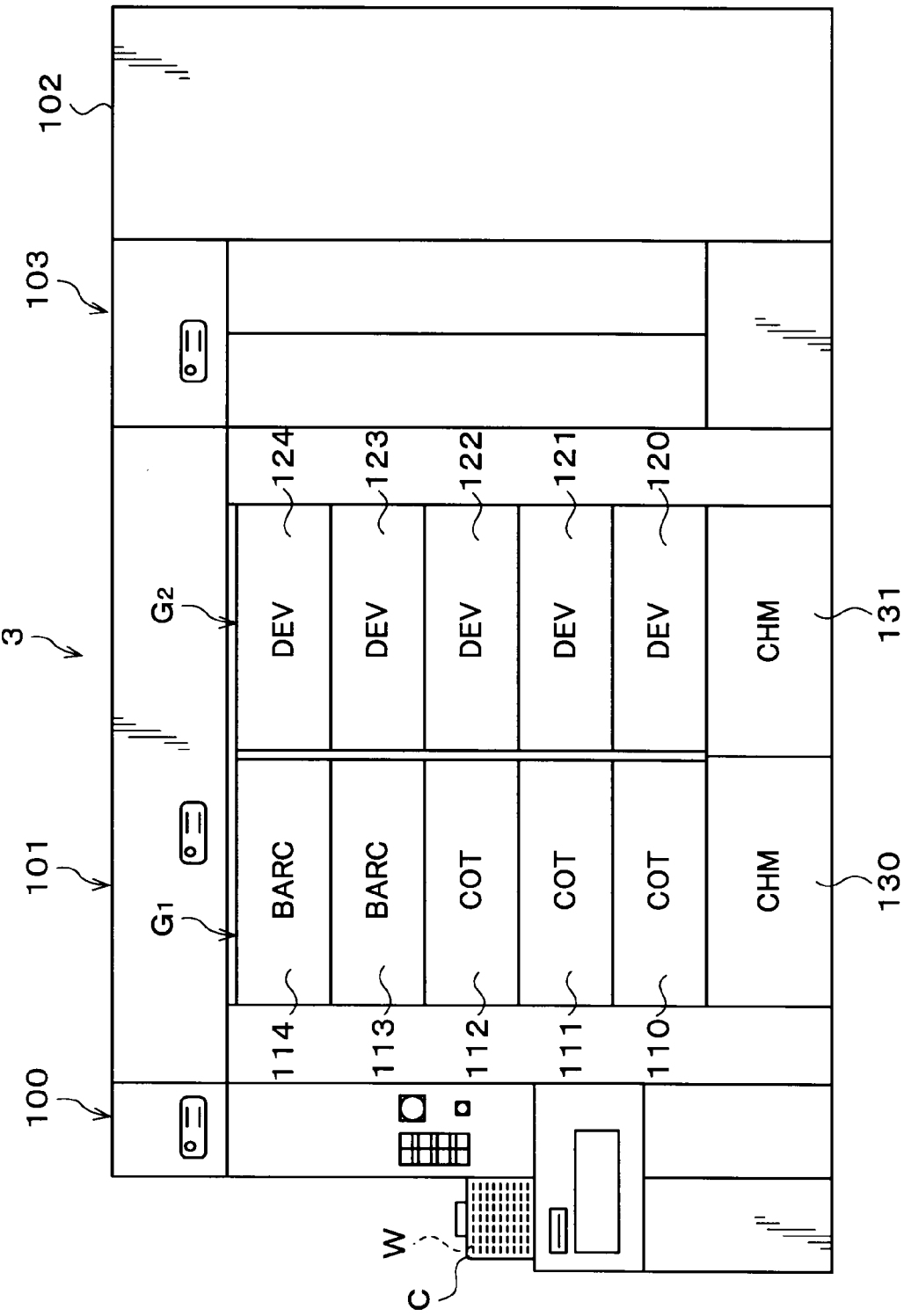
FIG. 7 is a front view of the coating and developing treatment apparatus.

In the first processing unit group G1, as shown in FIG. 7, solution treatment units each for supplying a predetermined liquid to the wafer W to perform treatment, for example, resist coating units 110, 111, and 112 each for applying a resist solution to the wafer W, and bottom coating units 113 and 114 each for forming an anti-reflection film that prevents reflection of light at the time of exposure processing, are five-tiered in order from the bottom. In the second processing unit group G2, solution treatment units, for example, developing treatment units 120 to 124 each for supplying a developing solution to the wafer W to develop it are five-tiered in order from the bottom. Further, chemical rooms 130 and 131 each for supplying various kinds of treatment solutions to the solution treatment units in the processing unit groups G1 and G2 are provided at the lowermost tiers of the first processing unit group G1 and the second processing unit group G2, respectively.

Figure 8:
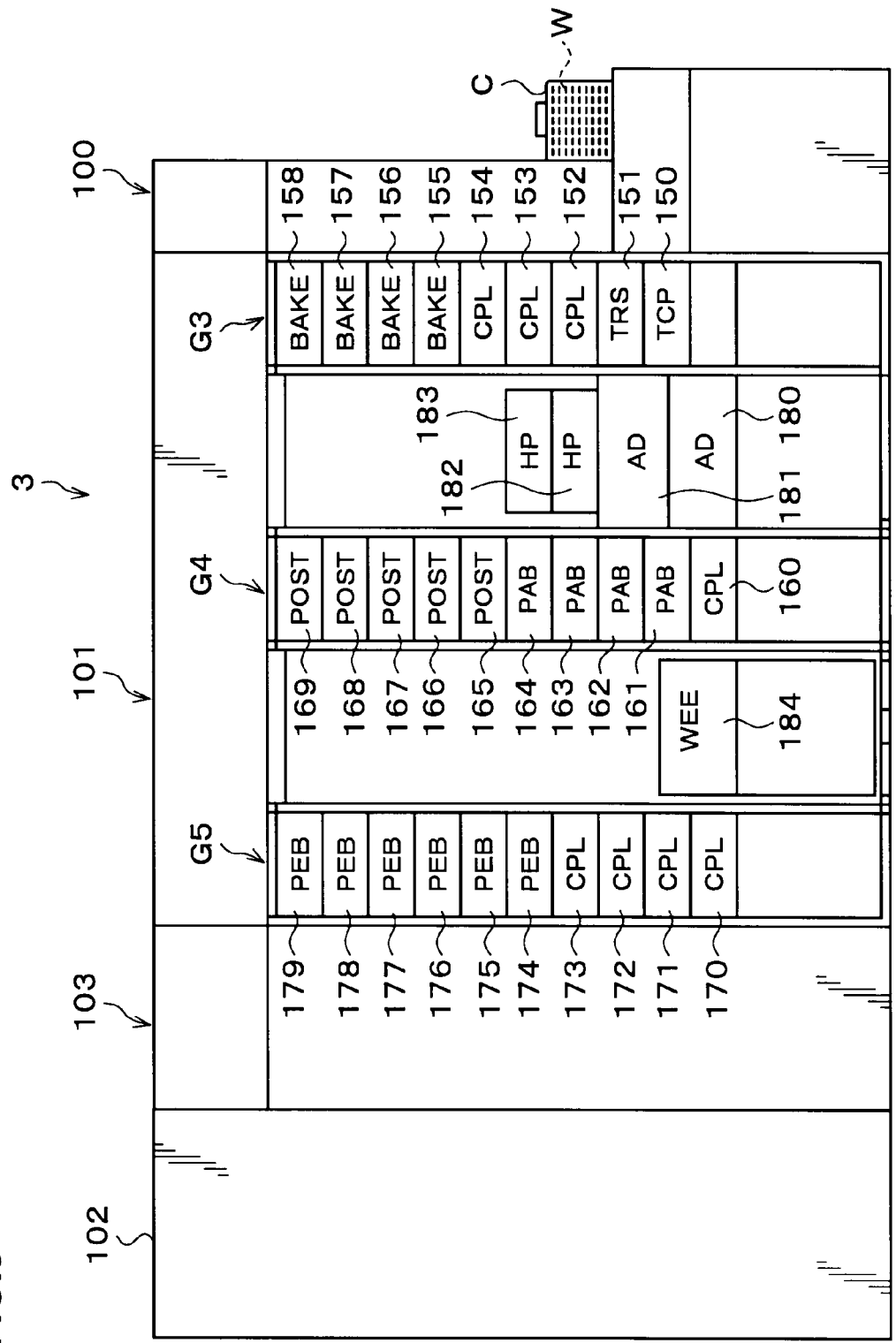
FIG. 8 is a rear view of the coating and developing treatment apparatus.

As shown in FIG. 8, in the third processing unit group G3, for example, the temperature regulating unit 150, the transition unit 151, high-precision temperature regulating units 152 to 154 each for temperature-regulating the wafer W under temperature control with a high precision, and high-temperature thermal processing units 155 to 158 each for heat-processing the wafer W at a high temperature, are nine-tiered in order from the bottom.

In the fourth processing unit group G4, for example, a high-precision temperature regulating unit 160, pre-baking units 161 to 164 (hereinafter, referred to as "PAB units") each for heat-processing the wafer W after resist coating treatment, and post-baking units 165 to 169 (hereinafter, referred to as "POST units") each for heat-processing the wafer W after developing treatment, are ten-tiered in order from the bottom.

In the fifth processing unit group G5, a plurality of thermal processing units each for thermally processing the wafer W, for example, high-precision temperature regulating units 170 to 173, PEB units 174 to 179 each for heat-processing the wafer W after exposure are ten-tiered in order from the bottom.

On the positive direction side in the X-direction of the first transfer unit 107 as shown in FIG. 6, a plurality of processing and treatment units are arranged, adhesion units 180 and 181 each for performing hydrophobic treatment on the wafer W and heating units 182 and 183 each for heating the wafer W being four-tiered in order from the bottom as shown in FIG. 8. As shown in FIG. 6, on the positive direction side in the X-direction of the second transfer unit 108, for example, an edge exposure unit 184 is disposed which selectively exposes only the edge portion of the wafer W to light.

In the interface station 103, for example, a wafer transfer body 191 moving on a transfer path 190 extending in the X-direction and a buffer cassette 192 are provided as shown in FIG. 6. The wafer transfer body 191 is movable in the Z-direction and also rotatable in the θ-direction and thus can access the aligner 102 adjacent to the interface station 103, the buffer cassette 192, and the fifth processing unit group G5 and transfer the wafer W to them.

Figure 9:
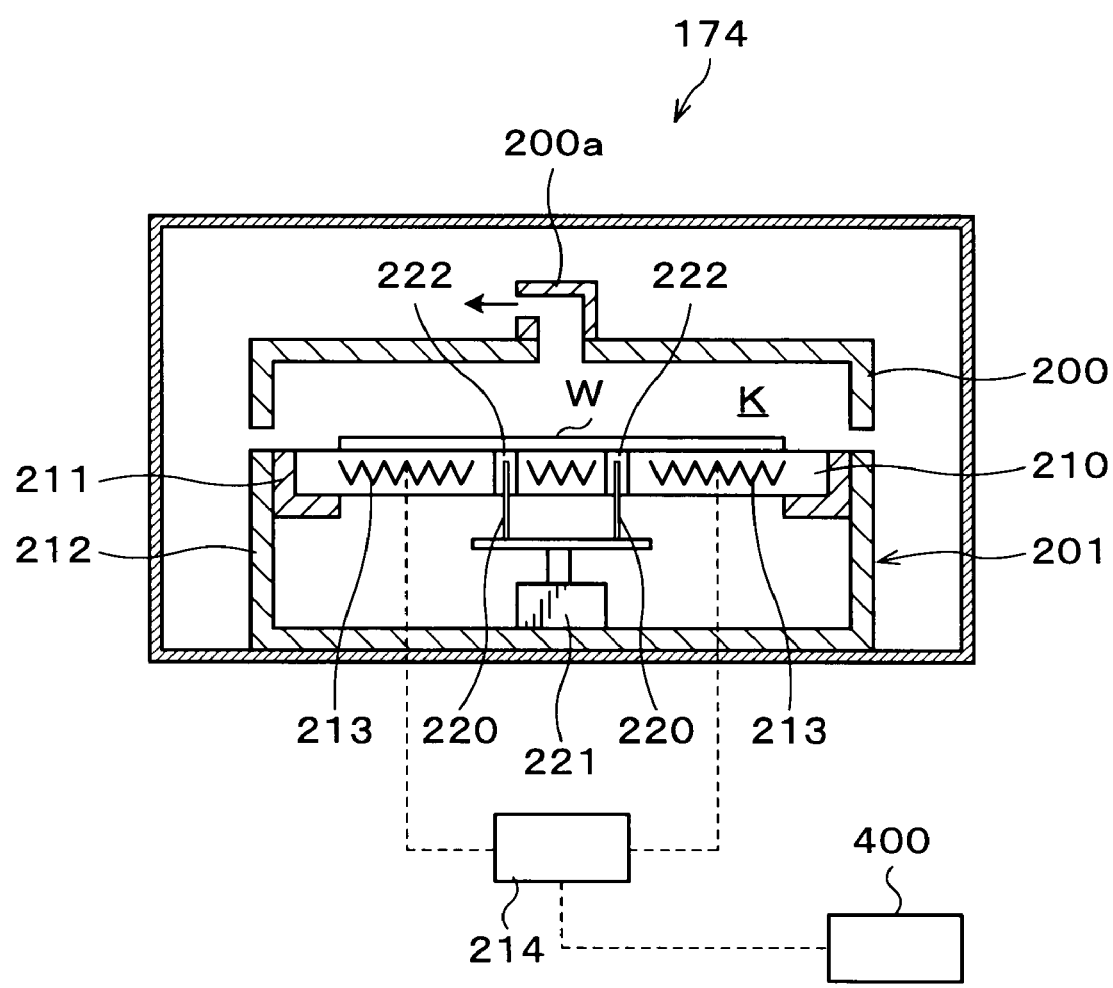
FIG. 9 is a longitudinal sectional view showing the outline of a configuration of a PEB unit.

Next, the configuration of the aforementioned PEB units 174 and 179 will be described. As shown in FIG. 9, in the PEB unit 174, a lid body 200 that is located on the upper side and vertically movable, and a thermal plate accommodating part 201 that is located on the lower side and forms a processing room K together with the lid body 200, are provided.

The lid body 200 has an almost cylindrical shape with a lower face open. The central portion of the upper surface of the lid body 200 is provided with an exhaust portion 200a. The atmosphere in the processing room K is uniformly exhausted through the exhaust portion 200a.

The thermal plate accommodating part 201 has, for example, an annular holding member 211 for accommodating a thermal plate 210 and holding the outer peripheral portion of the thermal plate 210, and a support ring 212 almost in a cylindrical shape surrounding the outer periphery of the holding member 211.

Figure 10:
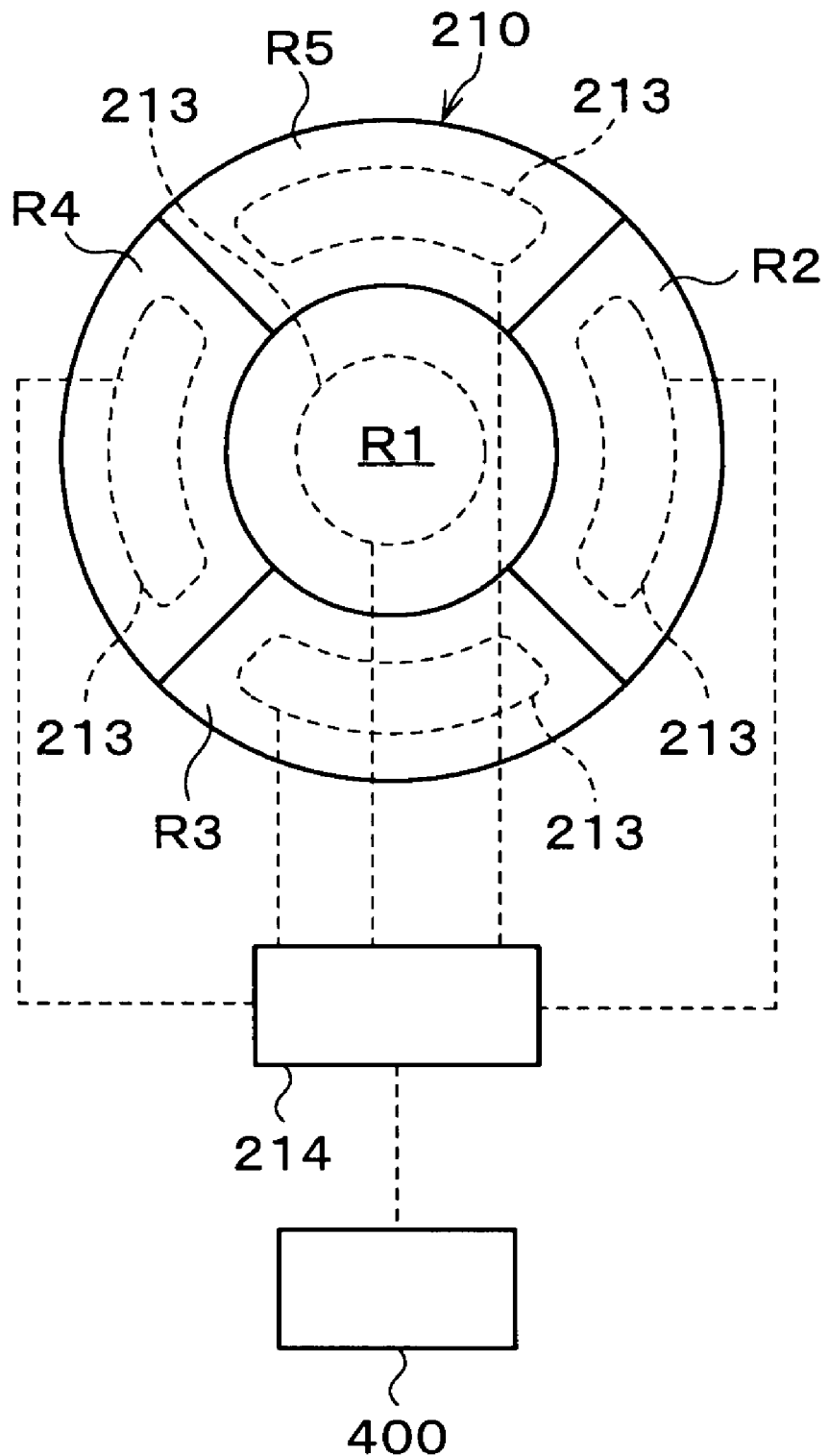
FIG. 10 is a plan view showing a configuration of a thermal plate of the PEB unit.

The thermal plate 210 is divided into a plurality of, for example, five thermal plate regions $R_1$, $R_2$, $R_3$, $R_4$, and $R_5$ as shown in FIG. 10. The thermal plate 210 is divided, for example, into a circular thermal plate region $R_1$ located at the central portion as seen from above and thermal plate regions $R_2$ to $R_5$ which are made by equally dividing the peripheral portion around the thermal plate region $R_1$ into four sectors. A heater 213 generating heat by power feeding is individually embedded in each of the thermal plate regions $R_1$ to $R_5$ of the thermal plate 210 and can heat each of the thermal plate regions $R_1$ to $R_5$. The heating value of each of the heaters 213 of the thermal plate regions $R_1$ to $R_5$ is adjusted by a temperature controller 214. The temperature controller 214 can adjust the heating value of the heater 213 to control the temperature of each of the thermal plate regions $R_1$ to $R_5$ to a predetermined heating temperature. The setting of the heating temperature in the temperature controller 214 is performed, for example, by the later-described control unit 400.

As shown in FIG. 9, raising and lowering pins 220 for supporting the wafer W from below and raising and lowering the wafer W are provided below the thermal plate 210. The raising and lowering pins 210 are vertically movable by means of a raising and lowering drive mechanism 221. Through holes 222 passing through the thermal plate 210 in the thickness direction are formed near the central portion of in the thermal plate 210. The raising and lowering pins 220 can rise from below the thermal plate 210 and pass through the through holes 222 to project to above the thermal plate 210.

Note that the configurations of the PEB units 175 to 179 are the same as that of the above-described PEB unit 174, and therefore description thereof will be omitted.

Figure 11:
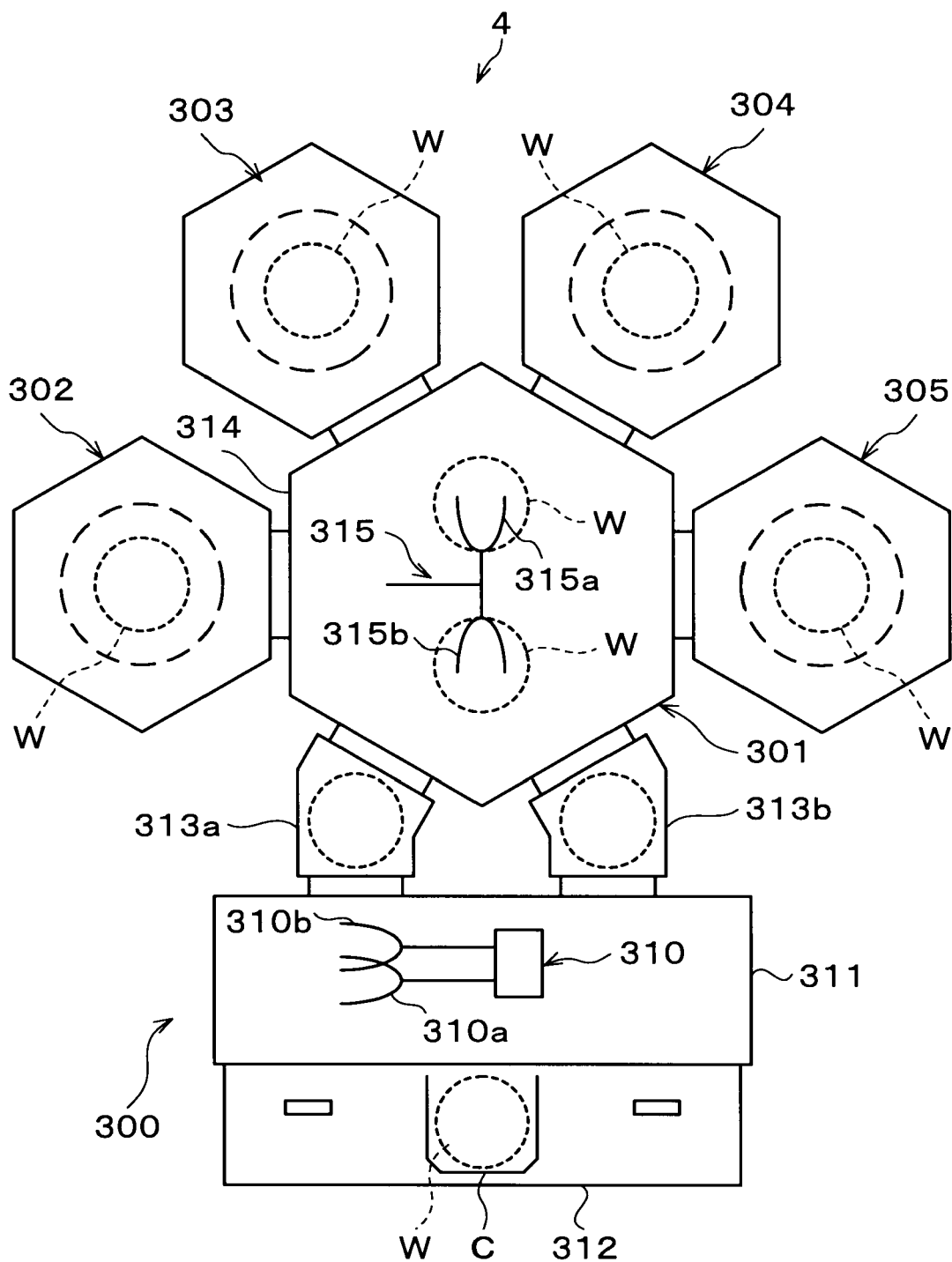
FIG. 11 is a plan view showing the outline of a configuration of an etching treatment apparatus.

The etching treatment apparatus 4 has, as shown in FIG. 11, a cassette station 300 for transferring-in/out the wafer W to/from the etching treatment apparatus 4, a common transfer unit 301 for transferring the wafer W, etching units 302 and 303 for etching the processing film F above the wafer W into a predetermined pattern, and pattern dimension measuring units 304 and 305 as pattern dimension measuring units each for measuring the dimension of the pattern of the processing film F.

The cassette station 300 has a transfer room 311 in which a wafer transfer mechanism 310 for transferring the wafer W is provided. The wafer transfer mechanism 310 has two transfer arms 310a and 310b each for substantially horizontally holding the wafer W, and is configured to transfer the wafer W while holding the wafer W by one of the transfer arms 310a and 310b. On the side of the transfer room 311, a cassette mounting table 312 is provided on which a cassette C capable of housing a plurality of wafers W one above the other therein is mounted. In the illustrated example, a plurality of, for example, three cassettes C can be mounted on the cassette mounting table 312.

The transfer room 311 and the common transfer unit 301 are coupled to each other via two load-lock units 313a and 313b which can be evacuated.

The common transfer unit 301 has a transfer chamber 314 having a closable structure formed in a substantially polygonal shape (a hexagonal shape in the illustrated example) as seen from above. In the transfer chamber 314, a wafer transfer mechanism 315 for transferring the wafer W is provided. The wafer transfer mechanism 315 has two transfer arms 315a and 315b each for substantially horizontally holding the wafer W, and is configured to transfer the wafer W while holding the wafer W by one of the transfer arms 315a and 315b.

Outside the transfer chamber 314, the etching units 302 and 303, the pattern dimension measuring units 304 and 305, and the load-lock units 313a and 313b are arranged such that they surround the periphery of the transfer chamber 314, for example, arranged in this order in the clockwise direction as seen from above and opposed to six side surface portions of the transfer chamber 314.

Figure 12:
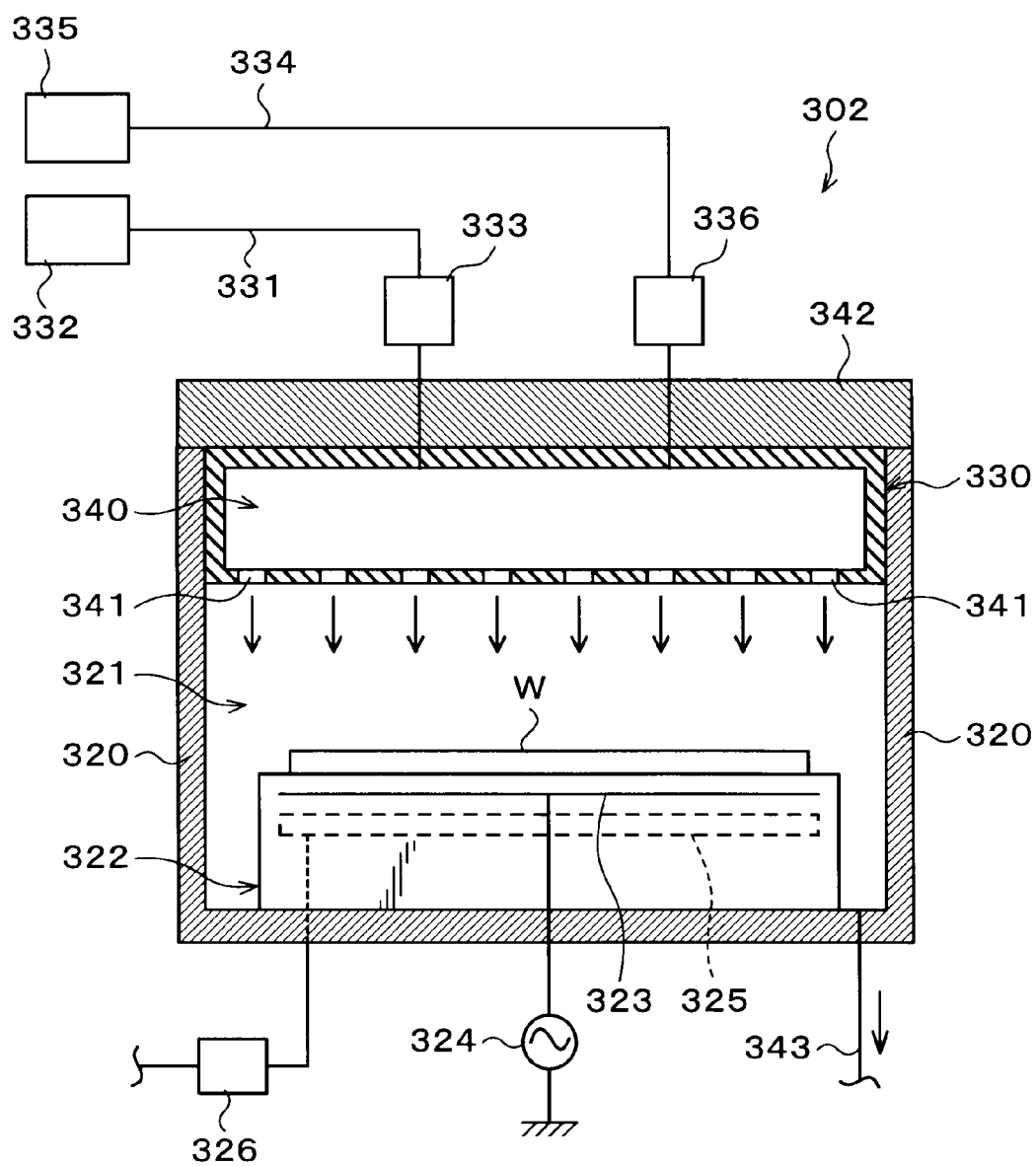
FIG. 12 is a longitudinal sectional view showing the outline of a configuration of an etching unit.

Next, the etching unit 302 will be described. As shown in FIG. 12, the etching unit 302 has a chamber 320 with an upper portion open. In the upper opening of the chamber 320, a later-described shower head 330 is provided to close a processing chamber 321 that is the internal space of the chamber 320.

In the processing chamber 321, a mounting table 322 is installed on which the wafer W is mounted. On the upper surface of the mounting table 322, the wafer W is held in a substantially horizontal attitude.

In the mounting table 322, an electrode plate 323 is embedded which is connected to a high frequency power source 324 for bias, for example, at 13.56 MHz. Electrostatic force is generated on the front surface of the mounting table 322 to electrostatically attract the substrate W onto the mounting table 322.

A temperature regulating mechanism 325 for allowing a cooling medium to flow therethrough is embedded in the mounting table 322. The temperature regulating mechanism 325 is connected to a liquid temperature regulating unit 326 for regulating the temperature of the cooling medium. The temperature of the cooling medium can be regulated by the liquid temperature regulating unit 326 to control the temperature of the mounting table 322. As a result, the wafer W mounted on the mounting table 322 can be kept at a predetermined temperature.

In the upper opening of the chamber 320, the shower head 330 is provided. To the shower head 330, a plasma gas supply source 332 is connected via a supply pipe 331. In the plasma gas supply source 332, for example, Ar gas, Xe gas, $O_2$ gas or the like is stored as a plasma gas for etching. The supply pipe 331 is provided with a flow rate regulator 333 for performing flow rate regulation of the plasma gas to be supplied from the plasma gas supply source 332 to the shower head 330. A processing gas supply source 335 is connected to the shower head 330 via a supply pipe 334. In the processing gas supply source 335, for example, Ar gas, Xe gas, $CF_4$ gas, $C_4F_8$ gas, $C_5F_8$ gas or the like is stored as a processing gas for etching. The supply pipe 334 is provided with a flow rate regulator 336 for performing flow rate regulation of the processing gas to be supplied from the processing gas supply source 335 to the shower head 330.

Inside the shower head 330, an inner space 340 is provided into which the plasma gas supplied from the plasma gas supply source 332 and the processing gas supplied from the processing gas supply source 335 are introduced. The lower surface of the shower head 330 is provided with a plurality of discharge ports 341 for discharging the gasses introduced into the inner place 340 toward the inside of the processing chamber 321 such that the discharge ports 341 are distributed over the entire lower surface of the shower head 330. More specifically, the gasses in the inner space 340 are discharged via the plurality of discharge ports 341 above the wafer W mounted on the mounting table 322 and diffused in the whole processing chamber 321.

On top of the shower head 330, a radial line slot antenna 342 is provided which supplies a high-frequency microwave for generating plasma uniformly in two dimensions. To the radial line slot antenna 342, a microwave oscillator (not shown) is connected so that the microwave oscillates to the radial line slot antenna 342.

At the bottom surface of the chamber 320, an exhaust pipe 343 is provided. An exhaust pump (not shown) is connected to the exhaust pipe 343 and can exhaust the atmosphere in the processing chamber 321 via the exhaust pipe 343.

Note that the configuration of the etching unit 303 is the same as that of the above-described etching unit 302 and therefore the description thereof will be omitted.

Figure 13:
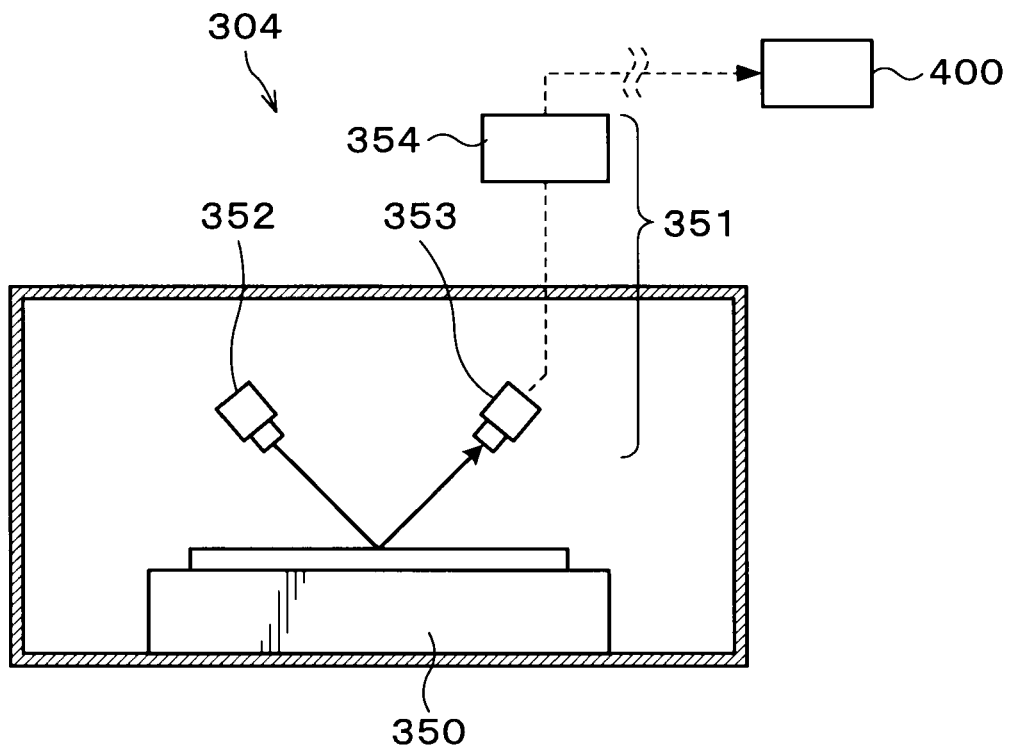
FIG. 13 is a longitudinal sectional view of the outline of a configuration of a pattern dimension measuring unit.

Next, a configuration of the pattern dimension measuring unit 304 will be described. In the pattern dimension measuring unit 304, as shown in FIG. 13, a mounting table 350 for horizontally mounting the wafer W thereon and an optical surface shape measuring device 351 are provided. The mounting table 350 can move, for example, in two dimensional directions which are horizontal directions. The optical surface shape measuring device 351 has a light applying part 352 for applying light in a slanting direction onto the wafer W, a light detecting part 352 for detecting the light applied from the light applying part 352 and reflected off the wafer W, and a measuring part 354 for calculating the dimension of the pattern of the processing film F above the wafer W based on the light reception information from the light detecting part 353. The pattern dimension measuring unit 304 measures the dimension of the pattern of the processing film F, for example, using the Scatterometry method. The pattern dimension measuring unit 304 can measure the dimension of the pattern of the processing film F by collating the light intensity distribution within the wafer detected by the light detecting part 353 with a previously stored imaginary light intensity distribution and obtaining the dimension of the pattern of the processing film F corresponding to the collated imaginary light intensity distribution. The measurement result of the pattern of the processing film F is outputted to the later-described control unit 400. Note that as the dimension of the pattern of the processing film, for example, the line width, the side wall angle, the diameter of the contact hole or the like is measured.

Further, when the Scatterometry method is used in the pattern dimension measuring unit 304, the film thickness, the n-value, and the k-value of the base film G can be measured in addition to the above-described measurement of the dimension of the pattern of the processing film F.

The pattern dimension measuring unit 304 can measure the pattern dimension of each of the plurality of regions within the wafer, for example, the wafer regions $W_1$ to $W_5$ shown in FIG. 4 by horizontally moving the wafer W relative to the light applying part 352 and the light detecting part 353.

Note that the configuration of the pattern dimension measuring unit 305 is the same as that of the pattern dimension measuring unit 304 and therefore the description thereof will be omitted.

Next, the control unit 400 which controls the heating temperature of the temperature controller 214 in each of the above-described PEB units 174 to 179 will be described. The control unit 400 is composed of, for example, a general-purpose computer comprising a CPU and a memory.

Figure 14:
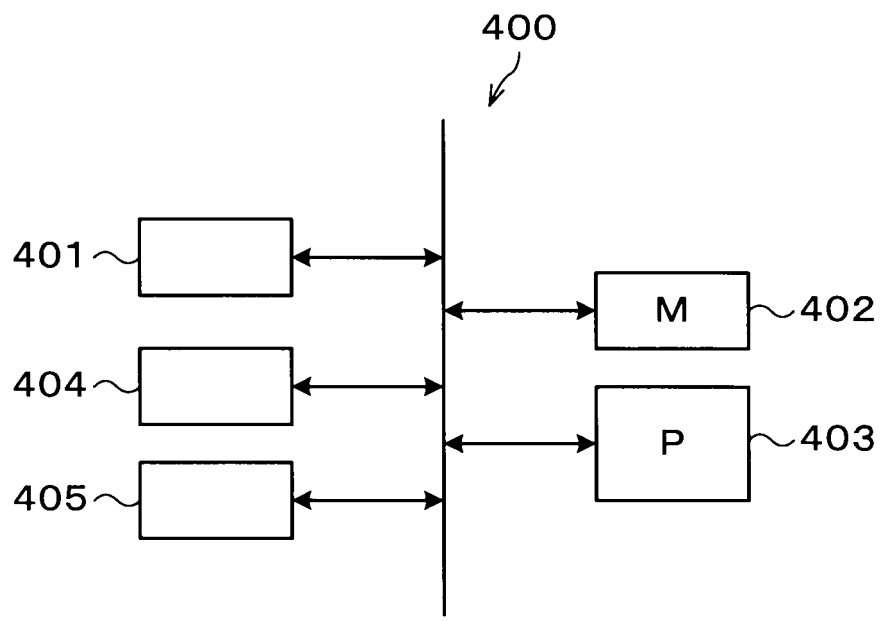
FIG. 14 is a block diagram showing a configuration of a control unit.

The control unit 400 has, for example, as shown in FIG. 14, an input part 401 into which the measurement results, for example, from the measuring apparatus 2 and the pattern dimension measuring unit 304 are inputted; a data storage part 402 for storing various kinds of information required to calculate the processing conditions of the PEB units 174 to 179 from the measurement result of the measuring apparatus 2; a program storage part 403 for storing a program P for calculating the processing conditions of the PEB units 174 to 179; a computing part 404 for executing the program P to calculate the processing conditions; and an output part 405 for outputting the calculated processing conditions to the PEB units 174 to 179.

Figure 15:
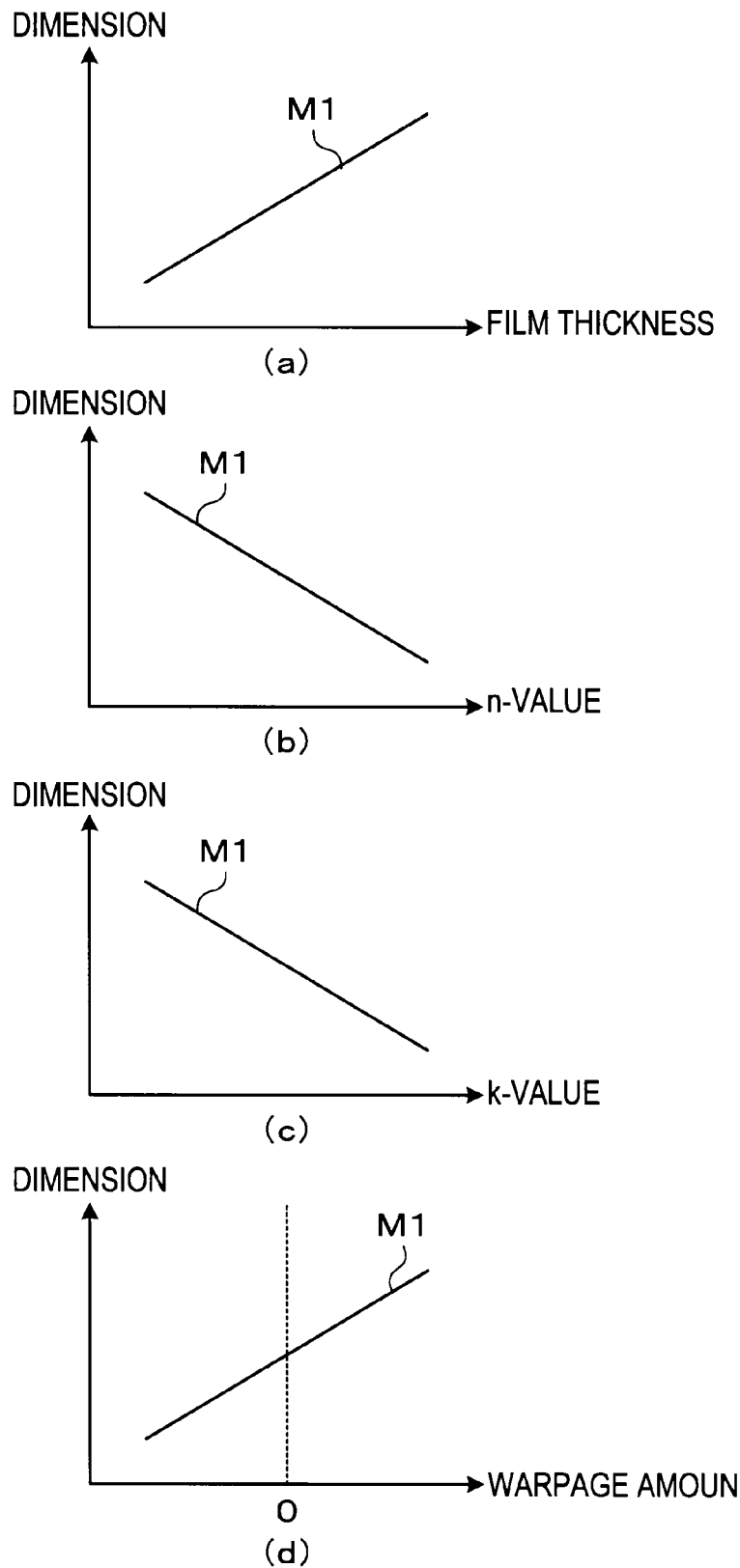
FIG. 15 shows graphs indicating a first correlation between an initial condition of a wafer and the dimension of a pattern of a processing film, FIG. 15(a) indicating the first correlation between the film thickness and the dimension of the pattern, FIG. 15(b) indicating the first correlation between an n-value and the dimension of the pattern, FIG. 15(c) indicating the first correlation between a k-value and the dimension of the pattern, and FIG. 15(d) indicating the first correlation between the warpage amount of the wafer and the dimension of the pattern.
Figure 16:
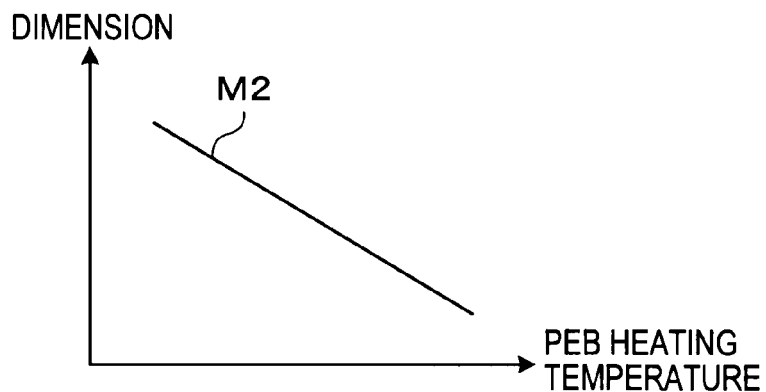
FIG. 16 is a graph indicating a second correlation between the heating temperature in the PEB unit and the dimension of the pattern of the processing film.

The data storage part 402 stores data indicating a first correlation M1 as a first relation between the initial condition of the wafer W and the dimension of the pattern of the processing film F as shown in FIG. 15. The initial condition of the wafer W is the film thickness, the n-value, or the k-value of each of the processing film F and the base film G or the warpage amount of the wafer W as described above, and data indicating the first correlation M1 for each of them is stored (FIG. 15(a) to (d)). Note that in FIG. 15(d), when the warpage amount of the wafer W is negative, the wafer W has a shape protruding downward, whereas when the warpage amount of the wafer W is positive, the wafer W has a shape protruding upward. Further, the data storage part 402 stores data indicating a second correlation M2 as a second relation between the heating temperature of the temperature controller 214 in each of the PEB units 174 to 179 and the dimension of the pattern of the processing film F as shown in FIG. 16. Note that the data of the correlations M1 and M2 are stored for each of the wafer regions $W_1$ to $W_5$ and each of the thermal plate regions $R_1$ to $R_5$.

The program P to realize the function of the control unit 400 may be one recorded on a computer-readable storage medium such as a computer-readable hard disk (HD), flexible disk (FD), compact disk (CD), magnetooptical disk (MO), or a memory card, and installed from the storage medium into the control unit 400.

Figure 17:
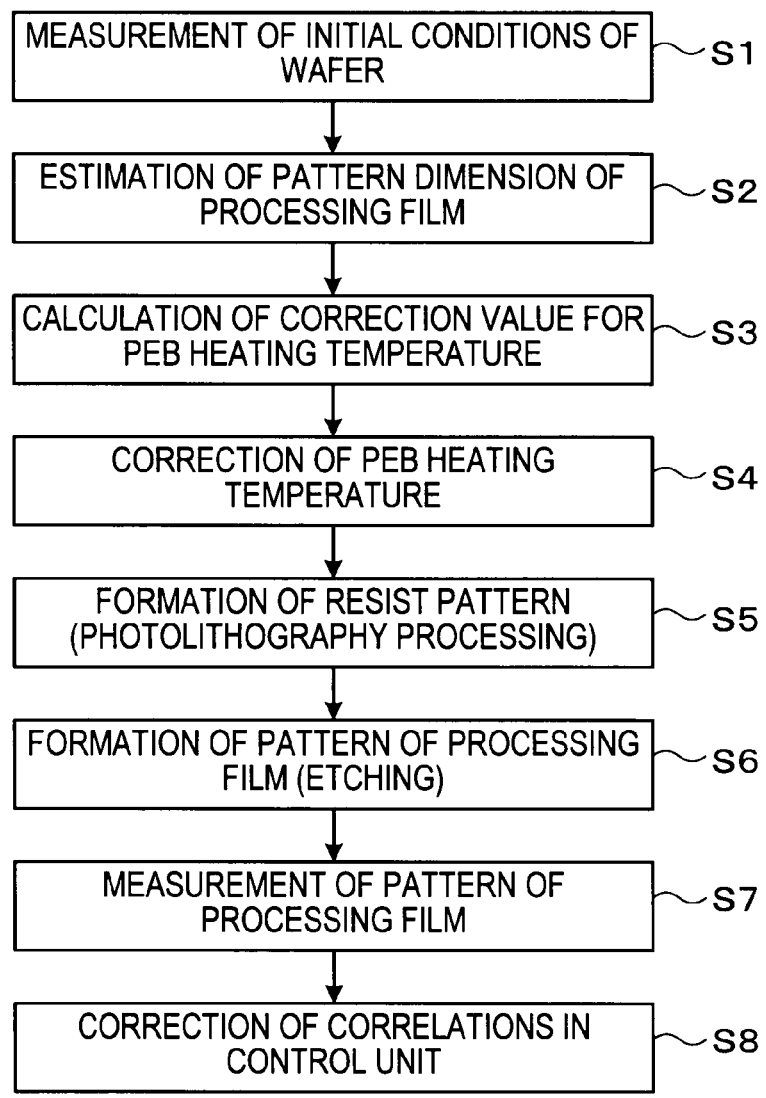
FIG. 17 is a flowchart showing steps of wafer processing.

The substrate processing system 1 according to this embodiment is configured as described above, and wafer processing performed in the substrate processing system 1 will be described next. FIG. 17 is a flowchart showing main steps of the wafer processing. Further, FIG. 18 is an explanatory view showing the state of films on and above the wafer W in each of the steps.

First, the cassette C housing wafers W is transferred into the cassette station 10 of the measuring apparatus 2. The wafer W is taken out from the cassette C by the wafer transfer body 13 and transferred to either the film measuring unit 20 or the warpage measuring unit 21 of the inspection station 11.

When the wafer W is transferred, for example, to the film measuring unit 20, the wafer W is suction-held by the chuck 30. Thereafter, light is applied from the optical interference measuring device 31 to the wafer W. In the measuring part 34, the film thickness, the n-value, and the k-value of each of the processing film F and the base film G as the initial conditions are measured for each of the wafer regions $W_1$ to $W_5$. The measurement results of the initial conditions are outputted to the control unit 400 (Step S1 in FIG. 17).

When the wafer is transferred, for example, to the warpage measuring unit 21, the wafer W is mounted on the mounting table 40. Each of the laser displacement gauges 46 and 47 then measures the distance between each of the laser displacement gauges 46 and 47 and the wafer W. The measurement results are outputted to the measuring part 49 and the warpage amount of the wafer W is measured as the initial condition of the wafer W for each of the wafer regions $W_1$ to $W_5$. The measurement result of the initial condition is outputted to the control unit 400 (Step S1 in FIG. 17).

In the control unit 400, the measurement result of the initial condition of the wafer W from the above-described measuring apparatus 2 is inputted into the input part 401. The program P stored in the program storage part 403 estimates the dimension of the pattern of the processing film F after the photolithography processing and the etching treatment from the first correlation M1 based on the measurement result of the initial condition (Step S2 in FIG. 17). Based on the estimation result of the pattern, a correction value for the heating temperature for each of the thermal plate regions $R_1$ to $R_5$ in the PEB units 174 to 179 is calculated from the second correlation M2 (Step S3 in FIG. 17). The calculated result is outputted from the output part 405 to the PEB units 174 to 179, and the heating temperature of the temperature controller 214 is corrected (Step S4 in FIG. 17). Accordingly, the wafer W is heated under the corrected heating condition, the dimension of the pattern of the processing film F is adjusted to a predetermined target dimension.

After completion of the measurement of the initial conditions of the wafer W in the inspection station 11 of the measuring apparatus 2, the wafer W is returned into the cassette C by the wafer transfer body 13. The cassette C having the wafers W housed therein is then transferred out of the measuring apparatus 2 and then transferred into the coating and developing treatment apparatus 3.

In the coating and developing treatment apparatus 3, one wafer W is first taken out of the cassette C on the cassette mounting table 104 by the wafer transfer body 106 and transferred to the temperature regulating unit 150 in the third processing unit group G3. The wafer W transferred to the temperature regulating unit 150 is temperature-regulated to a predetermined temperature, and then transferred by the first transfer unit 107 to the bottom coating unit 113, in which an anti-reflection film B is formed (FIG. 18(a)). The wafer W on which the anti-reflection film B has been formed is transferred by the first transfer unit 107 to the heating unit 182 and the high-precision temperature regulating unit 160 in sequence, in each of which the wafer W is subjected to predetermined processing. The wafer W is then transferred to the resist coating unit 110 in which a resist film R is formed above the wafer W (FIG. 18(b)).

When the resist film R has been formed above the wafer W in the resist coating unit 110, the wafer W is transferred by the first transfer unit 107 to the PAB unit 161, and then transferred by the second transfer unit 108 to the edge exposure unit 184 and the high-precision temperature regulating units 173 in sequence in each of which predetermined processing is performed. Thereafter, the wafer W is transferred by the wafer transfer body 191 in the interface station 103 to the aligner 102, in which a predetermined pattern is exposed to the resist film above the wafer W. The wafer W for which the exposure processing has been finished is transferred by the wafer transfer body 191 to the PEB unit 174 in which heat-processing is performed on the wafer W at the above-described heating temperature corrected for each of the wafer regions $W_1$ to $W_5$.

After completion of the thermal processing in the PEB unit 174, the wafer W is transferred by the second transfer unit 108 to the high-precision temperature regulating unit 170 and regulated in temperature, and is then transferred to the developing treatment unit 120 in which developing treatment is performed on the wafer W to develop the resist film. The wafer W is then transferred by the second transfer unit 108 to the POST unit 165 and subjected to heat-processing, and then transferred to the high-precision temperature regulating unit 152 and regulated in temperature. The wafer W is then transferred by the first transfer unit 107 to the transition unit 151, and returned by the wafer transfer body 106 to the cassette C, whereby a resist pattern T is formed above the wafer W (Step S5 in FIG. 17, FIG. 18(c)).

After the resist pattern T has been formed above the wafer W in the coating and developing treatment apparatus 3, the cassette C having the wafers W housed therein is transferred out of the coating and developing treatment apparatus 3 and then transferred into the etching treatment apparatus 4.

In the etching treatment apparatus 4, one wafer W is taken out of the cassette C on the cassette mounting table 312 by the wafer transfer mechanism 310 and transferred into the load-lock unit 313a. When the wafer W is transferred into the load-lock unit 313a, the inside of the load-lock unit 313a is closed and reduced in pressure. Thereafter, the inside of the load-lock unit 313a is communicated with the inside of the transfer chamber 314 in a state reduced in pressure relative to the atmospheric pressure (for example, in a substantially vacuum state). The wafer W is then transferred by the wafer transfer mechanism 315 out of the load-lock unit 313a and into the transfer chamber 314.

The wafer W transferred into the transfer chamber 314 is subsequently transferred by the wafer transfer mechanism 315 into the processing chamber 321 of the etching unit 302 and mounted on the mounting table 322 with its device formation surface being an upper surface. In this event, the mounting table 322 is regulated to a predetermined temperature by the temperature regulating mechanism 325. The processing chamber 321 is then closed, and the pressure in the processing chamber 321 is reduced to a pressure lower than the atmospheric pressure (for example, about −0.1 MPa (gauge pressure)). Thereafter, the plasma gas and the processing gas are supplied from the plasma gas supply source 332 and the processing gas supply source 335 at respective flow rates into the shower head 330, and the plasma gas is made into plasma by the microwave emitted from the radial line slot antenna 342. The plasma and the processing gas are supplied from the shower head 330 into the processing chamber 321. Thus, the plasma and processing gas are supplied to the wafer W under the reduced pressure for a predetermined period of time, whereby the processing film F above the wafer W is etched, the resist pattern T and the anti-reflection film B are then removed, resulting in a predetermined pattern X formed in the processing film (Step S6 in FIG. 17, FIG. 18(d)).

Thereafter, the processing chamber 321 is purged, and the wafer W is then transferred out of the processing chamber 321 by the wafer transfer mechanism 315. The wafer W transferred out of the processing chamber 321 is subsequently transferred into the pattern dimension measuring unit 304.

The wafer W transferred into the pattern dimension measuring unit 304 is mounted on the mounting table 350. Then, light is applied from the light applying part 352 to a predetermined portion of the wafer W, and its reflected light is detected by the light detecting part 353 so that the dimensions of the pattern X of the processing film F above the wafer W, for example, the line width, the side wall angle, the diameter of the contact hole, and the like are measured in the measuring part 354 (Step S7 in FIG. 17). The measurement results of the dimensions of the pattern X of the processing film F are outputted to the control unit 400.

In the control unit 400, the first correlation M1 is corrected based on the measurement results of the dimensions of the pattern X of the processing film F above the wafer W in the above-described pattern dimension measuring unit 304 and on the measurement results of the initial conditions of the wafer W in the measuring apparatus 2. In addition, the second correlation M2 is corrected based on the measurement results of the dimensions of the pattern X of the processing film F above the wafer W and on the heating temperature in the PEB unit 174 in which the wafer W has been subjected to heat-processing (Step S8 in FIG. 17). This further improves the correction accuracy of the heating temperature in each of the PEB units 174 to 179 for a wafer W' which will be processed next. Note that if the film thickness, the n-value and the k-value of the base film G have been measured as well as the dimensions of the pattern X of the processing film F in the pattern dimension measuring unit 304, the film thickness, the n-value or the k-value of the base film G in the pattern dimension measuring unit 304 can also be used for correcting the above-described first correlation M1 in place of the measurement results in the measuring apparatus 2.

After the dimensions of the pattern X of the processing film F above the wafer W have been measured in the pattern dimension measuring unit 304, the wafer W is returned by the wafer transfer mechanism 315 again to the transfer chamber 314. The wafer W is then delivered to the wafer transfer mechanism 310 via the load-lock unit 313b, and housed in the cassette C. Then the cassette C having the wafers W housed therein is then transferred out of the etching treatment apparatus 4, with which a series of wafer processing ends.

According to the above embodiment, the initial conditions affecting the pattern X of the processing film F above the wafer W have been measured in the measuring apparatus 2 before the photolithography processing and the etching treatment are performed on the wafer W, so that the correction value for the heating temperature in the heat-processing in the PEB unit 174 can be obtained from the first correlation M1 and the second correlation M2 based on the measurement results of the initial conditions. The heating temperature of the heat-processing in the PEB unit 174 is corrected based on the correction value and the heat-processing is then performed on the wafer W at the corrected heating temperature, so that the pattern X of the predetermined dimension can be formed in the processing film F above the wafer W. Accordingly, even when wafers W are successively processed, the heating temperature in the PEB unit 174 can be corrected for each of the wafers W according to the initial conditions of the wafer W, so that the pattern X of the processing film F can be formed in the predetermined dimensions.

Further, the dimensions of the pattern X formed in the processing film F are measured in the pattern dimension measuring unit 304, so that the first correlation M1 and the second correlation M2 can be corrected in the control unit 400 based on the measurement results of the dimensions of the pattern X. This makes it possible to correct more accurately the heating temperature in the PEB unit 174 for the wafers W which will be processed thereafter so as to form the pattern X of the processing film F in a predetermined pattern with reliability.

Though the heating temperature in each of the PEB units 174 to 179 is corrected by estimating the dimension of the pattern X of the processing film F in the control unit 400 in the above embodiment, the heating temperature in each of the PEB units 174 to 179 may be corrected by estimating a dimensional difference between the dimension of the resist pattern T and the pattern X of the processing film F (hereinafter, referred to as a "pattern dimensional difference"). The pattern dimensional difference here refers to the difference between a line width CD2 of the pattern X of the processing film F shown in FIG. 18(d) and a line width CD1 of the resist pattern T shown in FIG. 18(c). In this case, the data storage part 402 of the control unit 400 stores a first correlation M1' between the initial condition of the wafer W and the pattern dimensional difference as shown in FIG. 19(a) and a second correlation M2' between the heating temperature in each of the PEB units 174 to 179 and the pattern dimensional difference as shown in FIG. 19(b). Note that though data in the case where the initial condition of the wafer W is the film thickness of each of the processing film F and the base film G is shown in FIG. 19(a), the first correlation M1' on the n-value and the k-value which are other initial conditions or the warpage amount of the wafer W are similarly stored.

Figure 20:
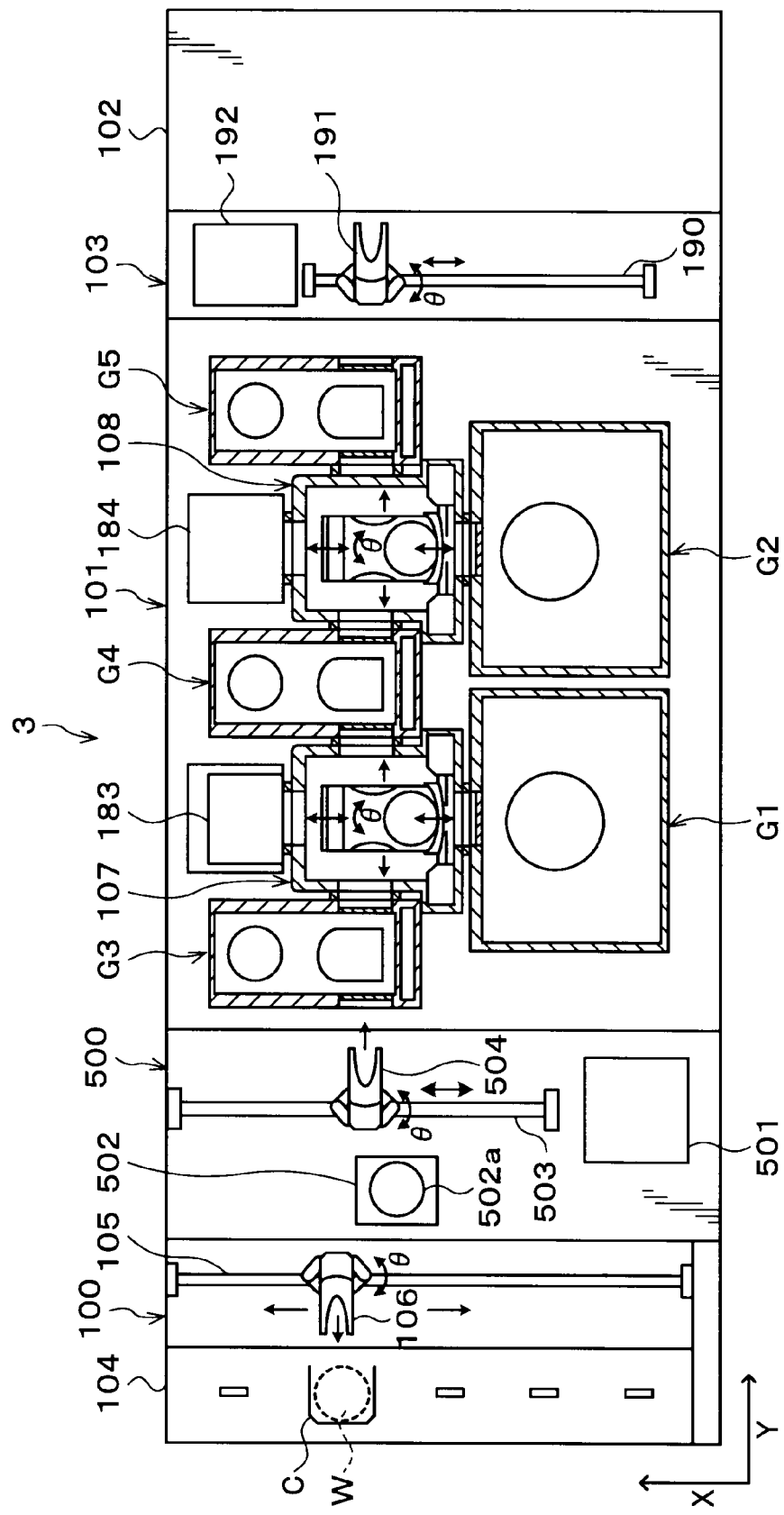
FIG. 20 is a plan view showing the outline of a configuration of a coating and developing treatment apparatus in the other embodiment.

In the coating and developing treatment apparatus 3, as shown in FIG. 20, an inspection station 500 for measuring the dimensions of the resist pattern T is located between the cassette station 100 and the processing station 101. In the inspection station 500, another pattern dimension measuring unit 501 is provided which measures the dimension of the resist pattern T above the wafer W. The pattern dimension measuring unit 501 is located, for example, on the side of the negative direction in the X-direction (the lower direction in FIG. 20) in the inspection station 500. For example, on the cassette station 100 side in the inspection station 500, a delivery unit 502 for delivering the wafer W to/from the cassette station 100 is located. In the delivery unit 502, for example, a mounting part 502a is provided which mounts the wafer W thereon. In the positive direction of the X-direction of the pattern dimension measuring unit 501 (the upper direction in FIG. 20), a wafer transfer unit 504 is provided which is movable, for example, along the X-direction on a transfer path 503. The wafer transfer unit 504 is movable, for example, in the vertical direction and also rotatable in a θ-direction, and thus can access the pattern dimension measuring unit 501, the delivery unit 502, and the processing and treatment units in the third processing unit group G3 on the processing station 4 side. Note that the configuration of the pattern dimension measuring unit 501 is the same as that of the above-described pattern dimension measuring unit 304, and therefore the description thereof will be omitted. Further, the remaining configuration of the substrate processing system 1 is the same as that of the substrate processing system 1 in the above-described embodiment.

In this case, the initial conditions of the wafer W are measured in the measuring apparatus 2 by the same method as in that above-described embodiment, and the measurement results are then outputted to the control unit 400 (Step S1 in FIG. 17). In the control unit 400, the pattern dimensional difference is estimated from the first correlation M1' based on the measurement result of the initial condition (Step S2 in FIG. 17). Based on this estimation result of the pattern dimensional difference, the correction value for the heating temperature in each of the PEB units 174 to 179 is calculated from the second correlation M2' (Step S3 in FIG. 17). Next, the heating temperature in each of the PEB units 174 to 179 is corrected by the same method as in the above-described embodiment (Step S4 in FIG. 17), and the photolithography processing is performed in the coating and developing treatment apparatus 3 to form a resist pattern T above the wafer W (Step S5 in FIG. 17). In this embodiment, the line width CD1 of the resist pattern T is measured in the pattern dimension measuring unit 501 of the same coating and developing treatment apparatus 3, and the measurement result is outputted to the control unit 400. After a pattern X is formed in the processing film F in the etching treatment apparatus 4 by the same method as in the above-described embodiment, the line width CD2 of the pattern X is then measured, and the measurement result is outputted to the control unit 400 (Steps S6 and S7 in FIG. 17). In the control unit 400, the first correlation M1' and the second correlation M2' are corrected based on the dimensional difference between the measured line width CD2 of the pattern X of the processing film and the line width CD1 of the resist pattern T (Step S8 in FIG. 17).

According to the above embodiment, even when wafers W are successively processed, the heating temperature in each of the PEB units 174 to 179 can be corrected for each of the wafers based on the pattern dimensional difference as described above, so that the pattern X of the processing film F can be formed in a predetermined dimension for each of the wafers W.

Figure 21:
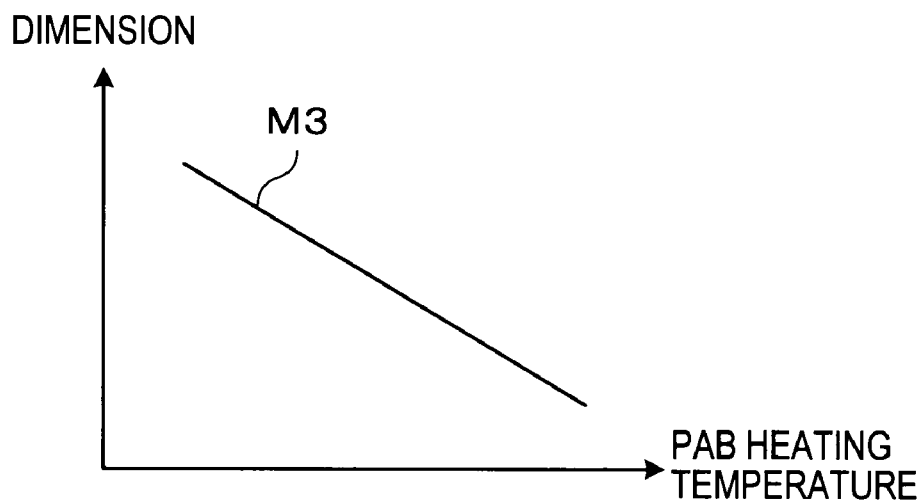
FIG. 21 is a graph indicating a second correlation between the heating temperature in a PAB unit and the dimension of the pattern of the processing film.

Though the heating temperature in each of the PEB units 174 to 179 is corrected in the above embodiments, the heating temperature in each of the PAB units 161 to 164 may be corrected instead. In this case, the data storage part 402 of the control unit 400 stores data indicating a second correlation M3 between the heating temperature in each of the PAB units 161 to 164 and the dimension of the pattern X of the processing film F as shown in FIG. 21. In the control unit 400, the dimension of the pattern X of the processing film F is estimated from the measurement result of the initial condition of the wafer W in the measuring apparatus 2 and the first correlation M1 as in the above-described embodiments (Step S2 in FIG. 17). Based on this estimation result of the pattern, the correction value for the heating temperature in each of the PAB units 161 to 164 is calculated from the second correlation M3 (Step S3 in FIG. 17). Thereafter, the wafer W is heated at the corrected heating temperature, whereby the dimension of the pattern X of the processing film F can be adjusted to the predetermined target dimension.

Figure 22:
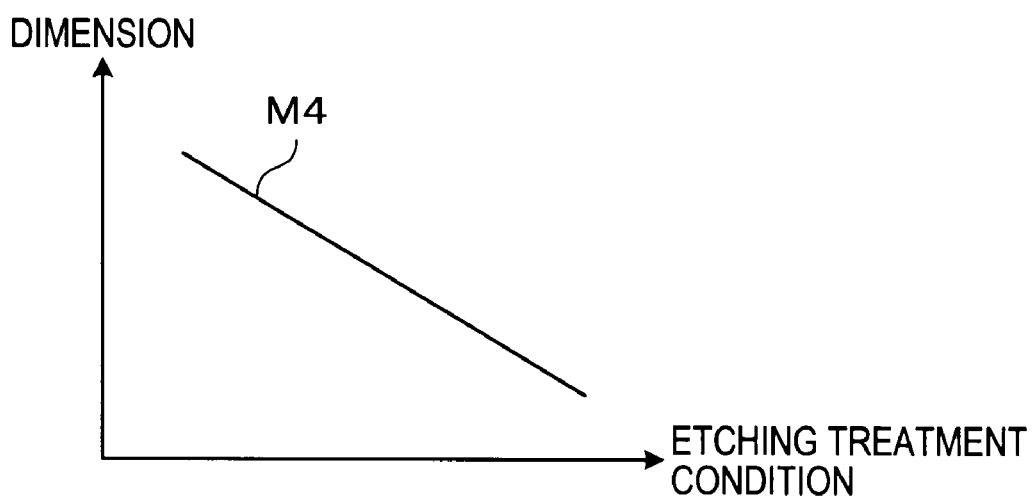
FIG. 22 is a graph showing a second correlation between the processing condition in the etching unit and the dimension of the pattern of the processing film.

Though the heating temperature in each of the PEB units 174 to 179 is corrected in the above embodiment, the processing condition in each of the etching units 302 and 303 may be corrected instead. As the processing condition, for example, the period of time of etching treatment, the temperature of the mounting table 322, the gas flow rates of the flow rate regulators 333 and 336 can be corrected. In this case, the data storage part 402 of the control unit 400 stores data indicating a second correlation M4 between the processing condition in each of the etching units 302 and 303 and the dimension of the pattern X of the processing film F as shown in FIG. 22. Also in this case, the correction value for the processing condition is calculated from the first correlation M1 and the second correlation M4 in the control unit 400 (Steps S2 and S3 in FIG. 17), and the wafer W is subjected to etching treatment under the corrected processing condition, whereby the dimension of the pattern X of the processing film F can be adjusted to the predetermined target dimension.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to those embodiments but can employ various forms. Though the cases where the processing conditions of the heat-processing in the PEB unit, the heat-processing in the PAB unit and the etching treatment in the etching treatment unit as the predetermined processing and treatment are corrected have been described in the embodiments, processing conditions in the described other processing and treatment, for example, the exposure processing in the aligner and the like may be corrected. Though the case where the processing film and its base film are formed above and on the wafer has been described in the above embodiments, the present invention is applicable to the case where only the processing film is formed on the wafer. The present invention is also applicable to the case where the substrate is other substrates such as an FPD (Flat Panel Display), a mask reticle for a photomask, or the like other than the wafer.

The present invention is useful when predetermined processing is performed on a substrate on or above which a processing film has been formed to form a predetermined patter in the processing film on or above the substrate.

What is claimed is:

1. A substrate processing method of performing predetermined processing on a substrate on which a processing film has been formed, to form a predetermined pattern in the processing film on the substrate, said method comprising:
    a first step of measuring, as an initial condition of the substrate, any of a film thickness of the processing film on the substrate, a refractive index of the processing film, an absorption coefficient of the processing film, and a warpage amount of the substrate;
    a second step of estimating a dimension of the pattern of the processing film after the predetermined processing from a previously obtained first relation between the initial condition and the dimension of the pattern of the processing film based on a measurement result of the initial condition;
    a third step of obtaining a correction value for a processing condition of the predetermined processing from a previously obtained second relation between the processing condition of the predetermined processing and the dimension of the pattern of the processing film based on an estimation result of the dimension of the pattern;
    a fourth step of correcting the processing condition of the predetermined processing based on the correction value; and
    a fifth step of performing predetermined processing on the substrate under the corrected processing condition to form the predetermined pattern in the processing film on the substrate.

2. The substrate processing method as set forth in claim 1,
    wherein in said fifth step, photolithography processing of forming a resist pattern on the processing film, and an etching treatment of forming the predetermined pattern in the processing film using the resist pattern as a mask are performed, and
    wherein the predetermined processing for which the processing condition is corrected in said fourth step is heat-processing which is performed after exposure processing and before a developing treatment in the photolithography processing.

3. The substrate processing method as set forth in claim 1,
wherein in said fifth step, photolithography processing of forming a resist pattern on the processing film, and an etching treatment of forming the predetermined pattern in the processing film using the resist pattern as a mask are performed, and wherein the predetermined processing for which the processing condition is corrected in said fourth step is heat-processing which is performed after a resist coating treatment and before exposure processing in the photolithography processing.

4. The substrate processing method as set forth in claim 1,
wherein in said fifth step, photolithography processing of forming a resist pattern on the processing film, and an etching treatment of forming the predetermined pattern in the processing film using the resist pattern as a mask are performed, and wherein the predetermined processing for which the processing condition is corrected in said fourth step is the etching treatment.

5. The substrate processing method as set forth in claim 1,
wherein in said fifth step, the dimension of the pattern of the processing film is measured, wherein the first relation is corrected using the dimension of the pattern of the processing film measured in said fifth step and the initial condition measured in said first step, and wherein the second relation is corrected using the dimension of the pattern of the processing film measured in said fifth step and the processing condition of the predetermined processing corrected in said fourth step.

6. The substrate processing method as set forth in claim 1,
wherein in said fifth step, photolithography processing of forming a resist pattern on the processing film, and an etching treatment of forming the predetermined pattern in the processing film using the resist pattern as a mask are performed, wherein the first relation is a correlation between the initial condition and a dimensional difference between the dimension of the pattern of the processing film and a dimension of the resist pattern, and wherein the second relation is a correlation between the processing condition of the predetermined processing and the dimensional difference between the dimension of the pattern of the processing film and the dimension of the resist pattern.

7. The substrate processing method as set forth in claim 6,
wherein in said fifth step, the dimension of the pattern of the processing film and the dimension of the resist pattern are measured, wherein the first relation is corrected using the dimensional difference between the dimension of the pattern of the processing film and the dimension of the resist pattern which are measured in said fifth step and the initial condition measured in said first step, and wherein the second relation is corrected using the dimensional difference between the dimension of the pattern of the processing film and the dimension of the resist pattern which are measured in said fifth step and the processing condition of the predetermined processing corrected in said fourth step.

8. The substrate processing method as set forth in claim 1,
wherein a base film for the processing film has further been formed on the substrate before said first step is performed, and wherein the initial condition is any of film thicknesses of the processing film and the base film, refractive indexes of the processing film and the base film, absorption coefficients of the processing film and the base film, and the warpage amount of the substrate.

9. A computer-readable storage medium storing a program running on a computer of a control unit which controls a substrate processing system in order to execute a substrate processing method by the substrate processing system, said substrate processing method being a substrate processing method of performing predetermined processing on a substrate on which a processing film has been formed, to form a predetermined pattern in the processing film on the substrate, said method comprising:

a first step of measuring, as an initial condition of the substrate, any of a film thickness of the processing film on the substrate, a refractive index of the processing film, an absorption coefficient of the processing film, and a warpage amount of the substrate;

a second step of estimating a dimension of the pattern of the processing film after the predetermined processing from a previously obtained first relation between the initial condition and the dimension of the pattern of the processing film based on a measurement result of the initial condition;

a third step of obtaining a correction value for a processing condition of the predetermined processing from a previously obtained second relation between the processing condition of the predetermined processing and the dimension of the pattern of the processing film based on an estimation result of the dimension of the pattern;

a fourth step of correcting the processing condition of the predetermined processing based on the correction value; and a fifth step of performing predetermined processing on the substrate under the corrected processing condition to form the predetermined pattern in the processing film on the substrate.

* * * * *